United States Patent
Huang et al.

(10) Patent No.: US 12,027,574 B2
(45) Date of Patent: Jul. 2, 2024

(54) RESISTOR STRUCTURE

(71) Applicant: Taiwan Semiconductor Manufacturing Company, Ltd., Hsin-Chu (TW)

(72) Inventors: Chih-Fan Huang, Kaohsiung (TW); Hsiang-Ku Shen, Hsinchu (TW); Dian-Hau Chen, Hsinchu (TW); Yen-Ming Chen, Chu-Pei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/358,557

(22) Filed: Jul. 25, 2023

(65) Prior Publication Data
US 2023/0387183 A1 Nov. 30, 2023

Related U.S. Application Data

(63) Continuation of application No. 17/460,564, filed on Aug. 30, 2021, now Pat. No. 11,791,371.

(51) Int. Cl.
*H01L 27/06* (2006.01)
*H01L 21/285* (2006.01)
(Continued)

(52) U.S. Cl.
CPC ........ *H01L 28/24* (2013.01); *H01L 21/28531* (2013.01); *H01L 27/0676* (2013.01); *H01L 27/0682* (2013.01); *H01L 27/0794* (2013.01); *H01L 27/101* (2013.01); *H01L 21/3212* (2013.01)

(58) Field of Classification Search
CPC .............. H01L 28/24; H01L 21/28531; H01L 21/3212; H01L 27/101; H01L 27/0794; H01L 27/0682; H01L 27/0676
See application file for complete search history.

(56) References Cited

U.S. PATENT DOCUMENTS 8,907,446 B2  12/2014 Summerfelt et al.
9,000,584 B2   4/2015 Lin et al.
(Continued)

OTHER PUBLICATIONS

Shen, Hsiang-Ku, et al., "Multilayer Capacitor Electrode", U.S. Appl. No. 16/888,429, filed May 29, 2020, Assignee: Taiwan Semiconductor Manufacturing Co., Ltd., Specification and Drawings, 40 pages.

*Primary Examiner* — David Vu
*Assistant Examiner* — Brandon C Fox
(74) *Attorney, Agent, or Firm* — Haynes and Boone, LLP

(57) ABSTRACT

Semiconductor structures and methods of forming the same are provided. A method according to an embodiment includes forming a conductive feature and a first conductive plate over a substrate, conformally depositing a dielectric layer over the conductive feature and the first conductive plate, conformally depositing a conductive layer over the conductive feature and the first conductive plate, and patterning the conductive layer to form a second conductive plate over the first conductive plate and a resistor, the resistor includes a conductive line extending along a sidewall of the conductive feature. By employing the method, a high-resistance resistor may be formed along with a capacitor regardless of the resolution limit of, for example, lithography.

20 Claims, 36 Drawing Sheets

(51) Int. Cl.
  *H01L 23/522* (2006.01)
  *H01L 27/07* (2006.01)
  *H01L 27/10* (2006.01)
  *H01L 49/02* (2006.01)
  H01L 21/321 (2006.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,244,850 B2 * | 2/2022 | Liang ................ H01L 28/20 |
| 2020/0006183 A1 | 1/2020 | Huang |
| 2021/0288042 A1 * | 9/2021 | Lin .................. H01L 27/016 |
| 2023/0046455 A1 * | 2/2023 | Wong ................ H01L 28/24 |

\* cited by examiner

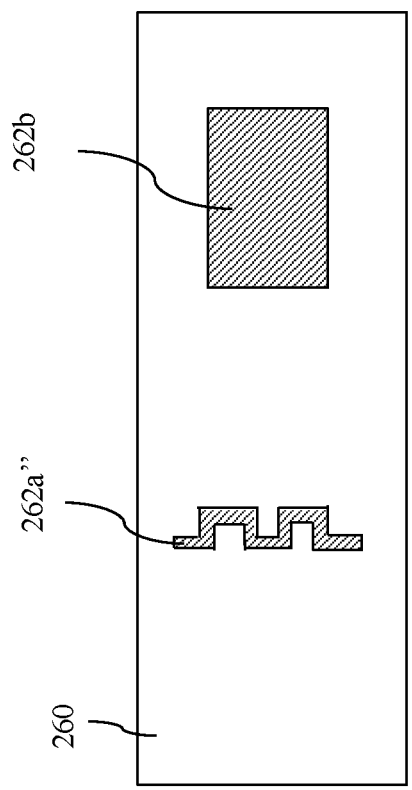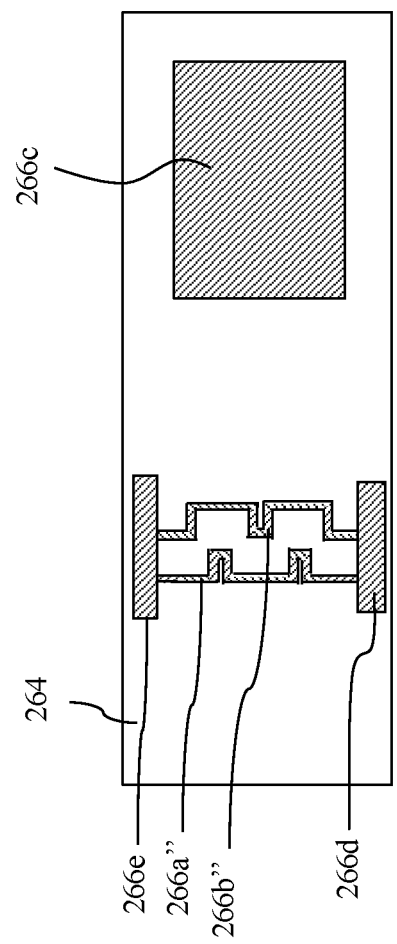

RESISTOR STRUCTURE

PRIORITY DATA

This is a continuation application of U.S. patent application Ser. No. 17/460,564, filed Aug. 30, 2021, and entitled "Resistor Structure," the entirety of which is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. This scaling down process generally provides benefits by increasing production efficiency and lowering associated costs. However, while transistors have scaled down considerably between generations, passive devices (e.g., resistors, capacitors, inductors, etc.) have not always progressed as quickly.

As the geometry size of IC devices decreases, passive devices that require large surface areas may be formed in a back-end-of-line (BEOL) process. Metal-Insulator-Metal (MIM) capacitors and resistors are among examples of such passive devices. However, scaling of resistors as well as formation of resistors with high resistance in advanced technology nodes are limited by the resolution of BEOL lithography processes. Thus, although existing structures and fabrication processes thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 34A-34B, 35A-35B, and 36A-36B are top views of exemplary shapes of portions of the workpiece undergoing the method according to various aspects of the present disclosure.

DETAILED DESCRIPTION

Figure 1:
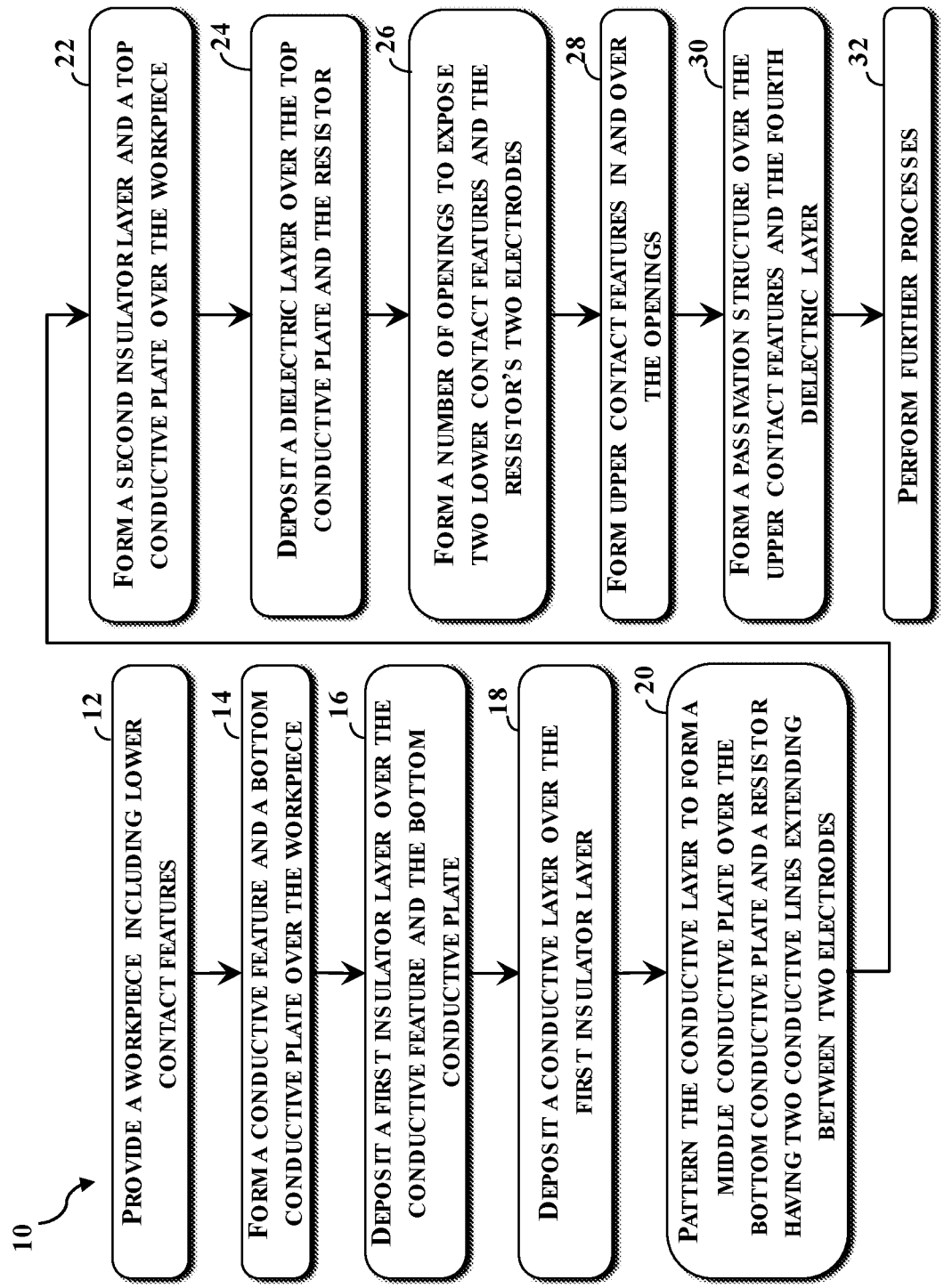
FIG. 1 is a flow chart of a method for fabricating an exemplary semiconductor structure in accordance with embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments, in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-Insulator-Metal (MIM) capacitors have been widely used in functional circuits such as mixed signal circuits, analog circuits, Radio Frequency (RF) circuits, Dynamic Random-Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. MIM capacitors are fabricated by a BEOL process to have a larger surface area. Other passive devices, such as resistors, are also commonly seen in functional circuits. For example, resistors may be used to adjust signal levels, divide voltages, and terminate transmission lines. Resistors formed near the first metal line may require additional lithography process steps. Such additional lithography process steps may result in increased cost.

The present disclosure relates to the formation of a semiconductor structure, including resistors and capacitors. The method of the present disclosure forms a resistor along with an MIM capacitor. In some embodiments, the MIM capacitor includes three electrode plates, and the resistor is formed along with either a middle plate or a top electrode plate. As the forming of the resistor shares a patterning process with the capacitor, the fabrication of the semiconductor structure may be significantly simplified, and the cost associated with the fabrication may be advantageously reduced. In addition, by using the method described below, a resistor may be fabricated to have a small width and achieve a high resistance without high-resolution photolithography.

The various aspects of the present disclosure will now be described in more detail with reference to the figures. In that regard, FIG. 1 is a flowchart illustrating a method 10 for fabricating a semiconductor structure according to embodiments of the present disclosure. Method 10 is described below in conjunction with FIGS. 2-25, which are diagrammatic fragmentary cross-sectional views and/or top views of the semiconductor structure at different stages of fabrication according to embodiments of the present disclosure. FIG. 26 is a flowchart illustrating a method 40 for fabricating another semiconductor structure according to embodiments of the present disclosure. Method 40 is described below in conjunction with FIGS. 27-33, which are diagrammatic fragmentary cross-sectional views of another semiconductor structure at different stages of fabrication according to embodiments of the present disclosure. Methods 10 and 40 are merely examples and are not intended to limit the present disclosure to what is explicitly illustrated in method 10 and/or method 40. Additional steps can be provided before, during, and after method 10 and/or method 40, and some steps described can be replaced, eliminated, or moved around for additional embodiments of the method. Not all steps are described herein in detail for reasons of simplicity.

Figure 2:
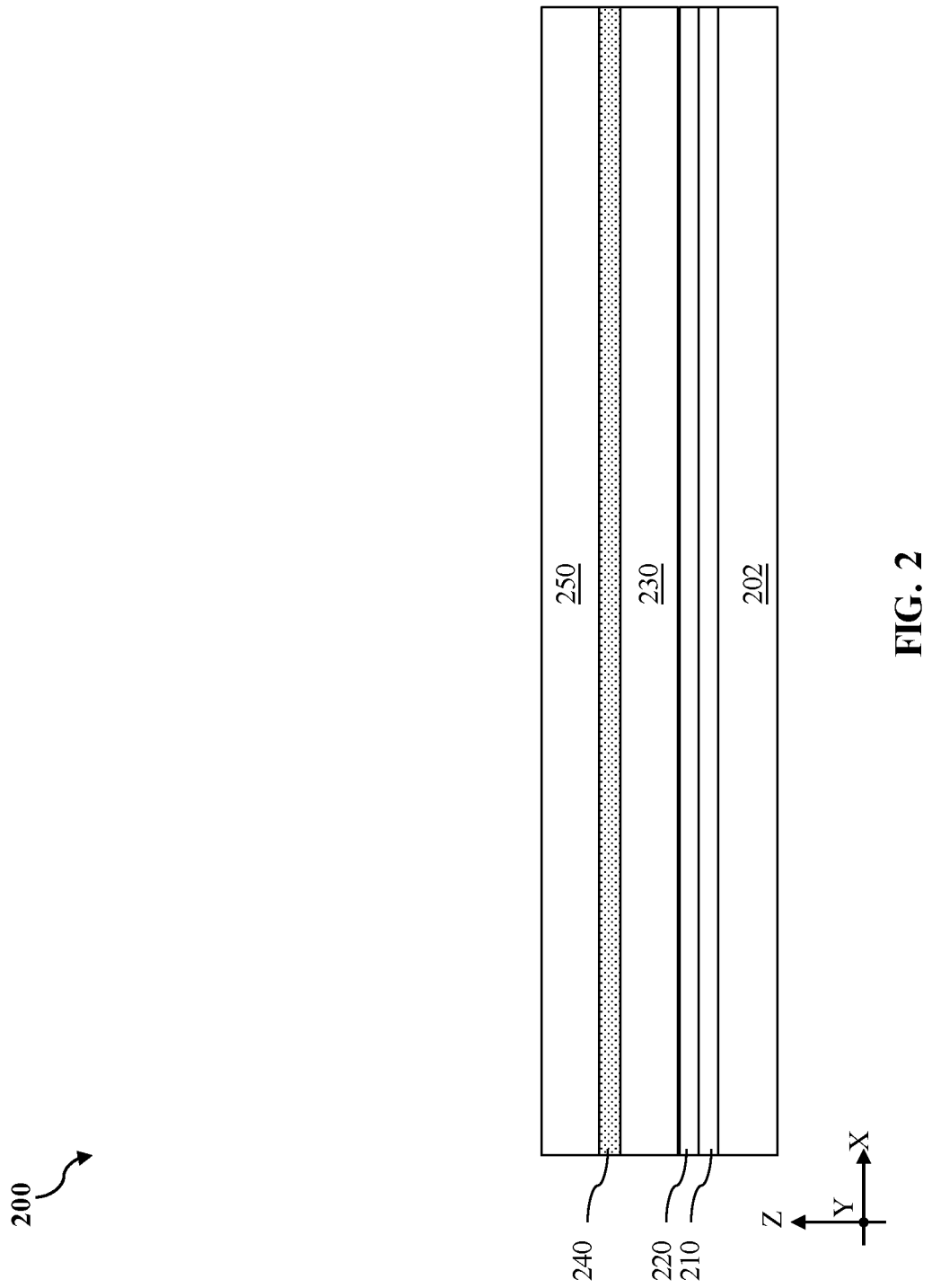
FIGS. 2-10, 12-13, and 16-25 are cross-sectional views of a portion of a workpiece undergoing the method according to various aspects of the present disclosure.

Referring to FIGS. 1-8, method 10 includes a block 12 where a workpiece 200 is provided with lower contact features. The workpiece 200 includes various layers already formed thereon. Because a semiconductor structure will be formed from the workpiece 200, workpiece 200 may be referred to as semiconductor structure 200 in suitable context. As shown in FIG. 2, the workpiece 200 includes a substrate 202, which may be made of silicon or other semiconductor materials such as germanium. The substrate 202 also may include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, for example an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. In some embodiments, the transistor components may be formed in the substrate 202 in a front-end-of-line (FEOL) process.

As shown in FIG. 2, the workpiece 200 also includes an interconnect layer 210. The interconnect layer 210 may be a multi-layered interconnect (MLI) structure, which is formed over the substrate 202 and may include multiple patterned dielectric layers and conductive layers that provide interconnections (e.g., wiring) between the various microelectronic components of the workpiece 200. There may be intermediate layers or components between the interconnect layer 210 and the substrate 202, but in the interest of simplicity such layers or components are not shown. In an embodiment, a thickness of the interconnect layer 210 is between about 169 nanometers (nm) and about 230 nm.

The interconnect layer 210 may include multiple conductive components as well as an interlayer dielectric (ILD) component (or an intermetal dielectric (IMD) component) that partially or fully surrounds the conductive components. The conductive components may include contacts, vias, or metal lines. The ILD component may be a silicon oxide or silicon oxide containing material where silicon exists in various suitable forms. As an example, the ILD component includes silicon oxide or a low-k dielectric material whose k-value (dielectric constant) is smaller than that of silicon oxide, which is about 4. In some embodiments, the low-k dielectric material includes a porous organosilicate thin film such as SiOCH, tetraethyl orthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbonitride (SiCN), silicon oxycarbonitride (SiOCN), spin-on silicon based polymeric dielectrics, or combinations thereof.

In an embodiment, a carbide layer 220 is deposited on the interconnect layer 210. The deposition process includes chemical vapor deposition (CVD), physical vapor deposition (PVD), atomic layer deposition (ALD), or combinations thereof. In some embodiments, the carbide layer 220 has a generally uniform thickness of between about 45 nm and about 70 nm. Any suitable type of carbide material such as silicon carbide (SiC) can be used in the carbide layer 220.

In an embodiment, an insulating layer 230 is deposited on the carbide layer 220. Any suitable deposition process may be used, including CVD, PVD, ALD, or combinations thereof. In some embodiments, the insulating layer 230 includes undoped silicon oxide. In some embodiments, the insulating layer 230 includes undoped silicate glass (USG). In an embodiment, the interconnect layer 210, the carbide layer 220 and the insulating layer 230 may be replaced with one or more interconnect structures.

In an embodiment, an etch stop layer (ESL) 240 is deposited on the insulating layer 230. In some embodiments, a thickness of the ESL 240 is between about 45 nm and about 55 nm. The ESL 240 may include silicon carbonitride (SiCN), silicon oxycarbide (SiOC), silicon carbide (SiC), silicon oxycarbonitride (SiOCN), or silicon nitride (SiN), or combinations thereof.

A first dielectric layer 250 may be deposited on the ESL 240. In some embodiments, the first dielectric layer 250 includes, for example, undoped silica glass (USG) or silicon oxide. In some embodiments, a thickness of the first dielectric layer 250 is about 800 nm and about 1000 nm.

Figure 3:
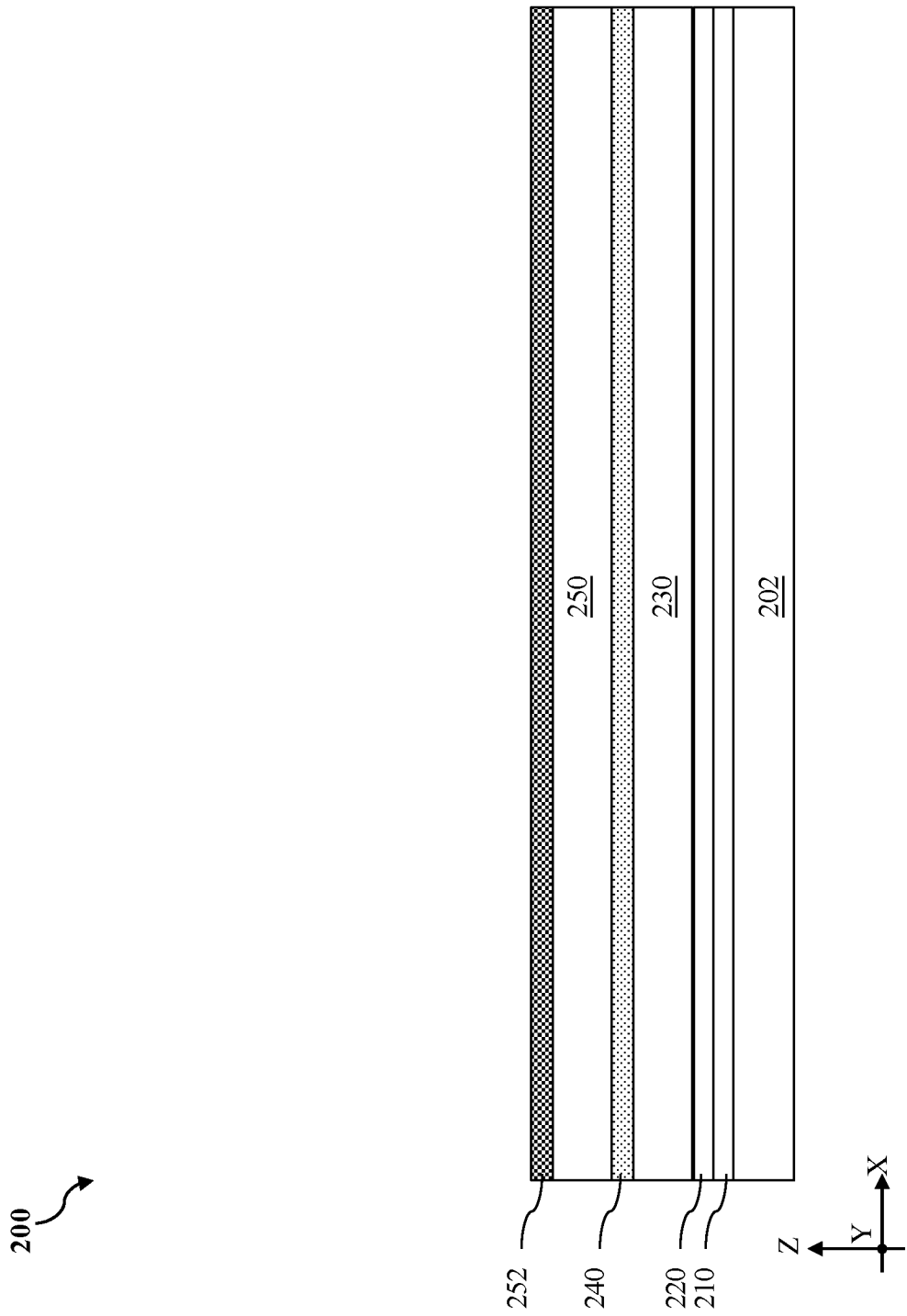
Figure 4:
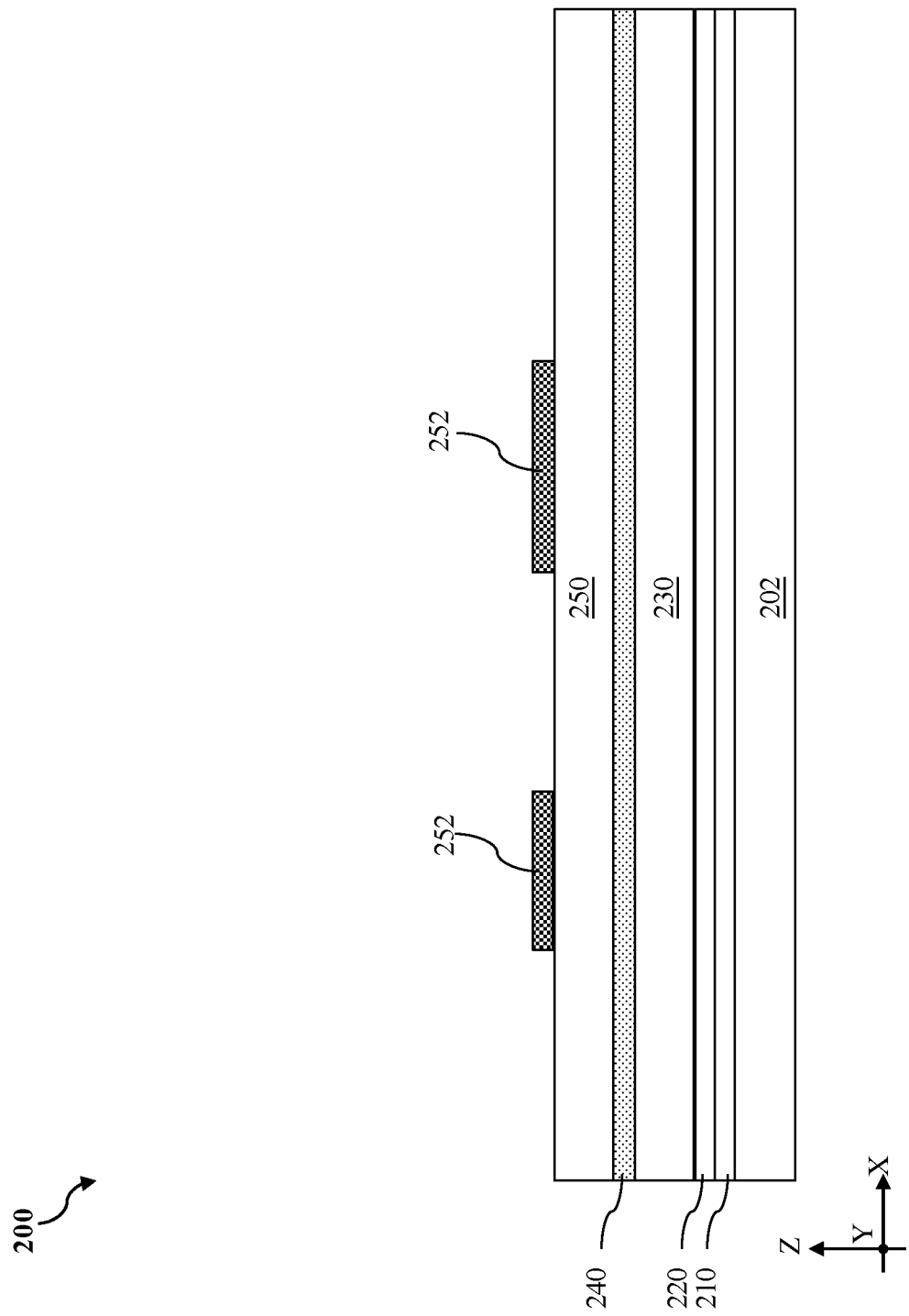
Figure 5:
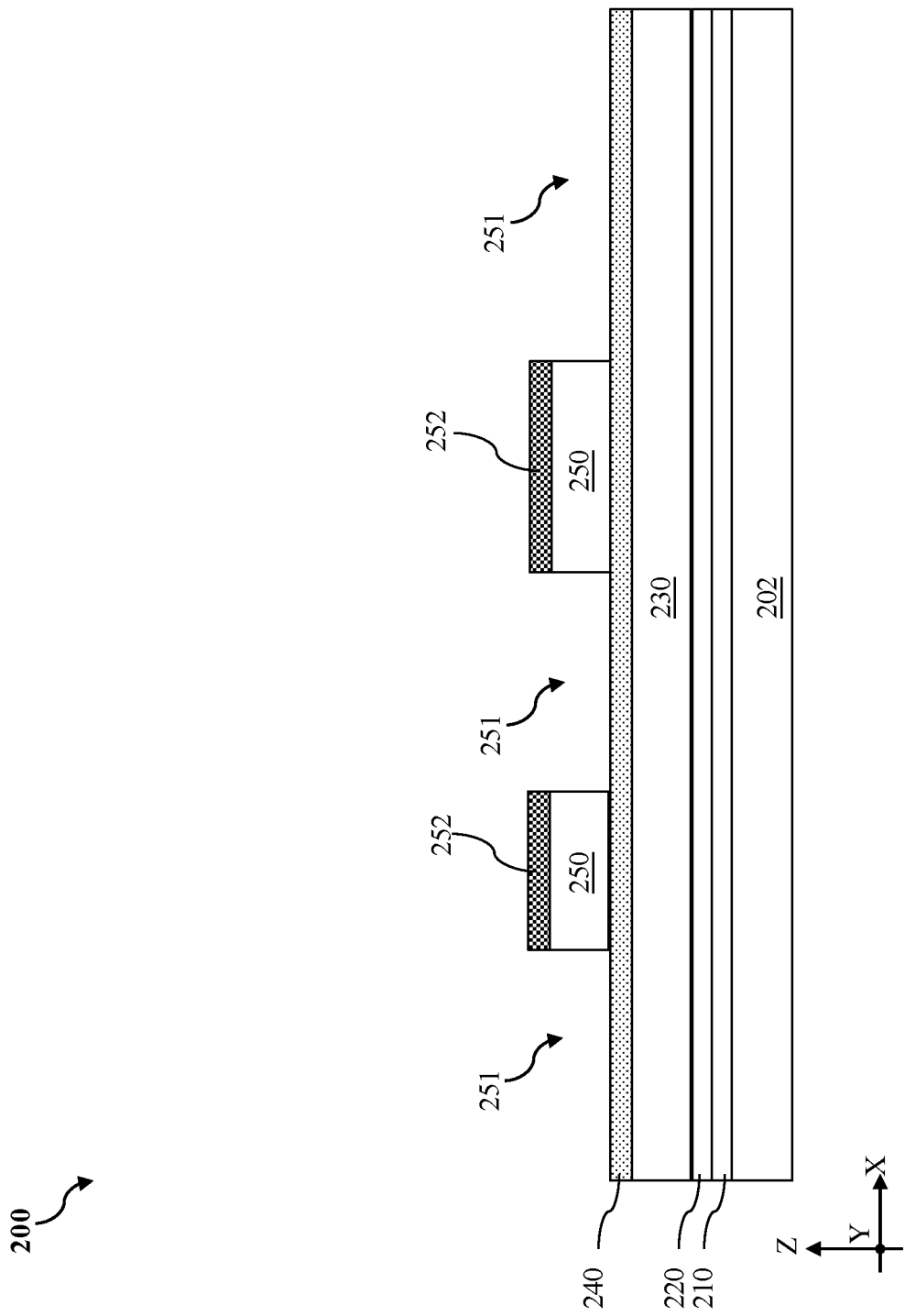
Figure 6:
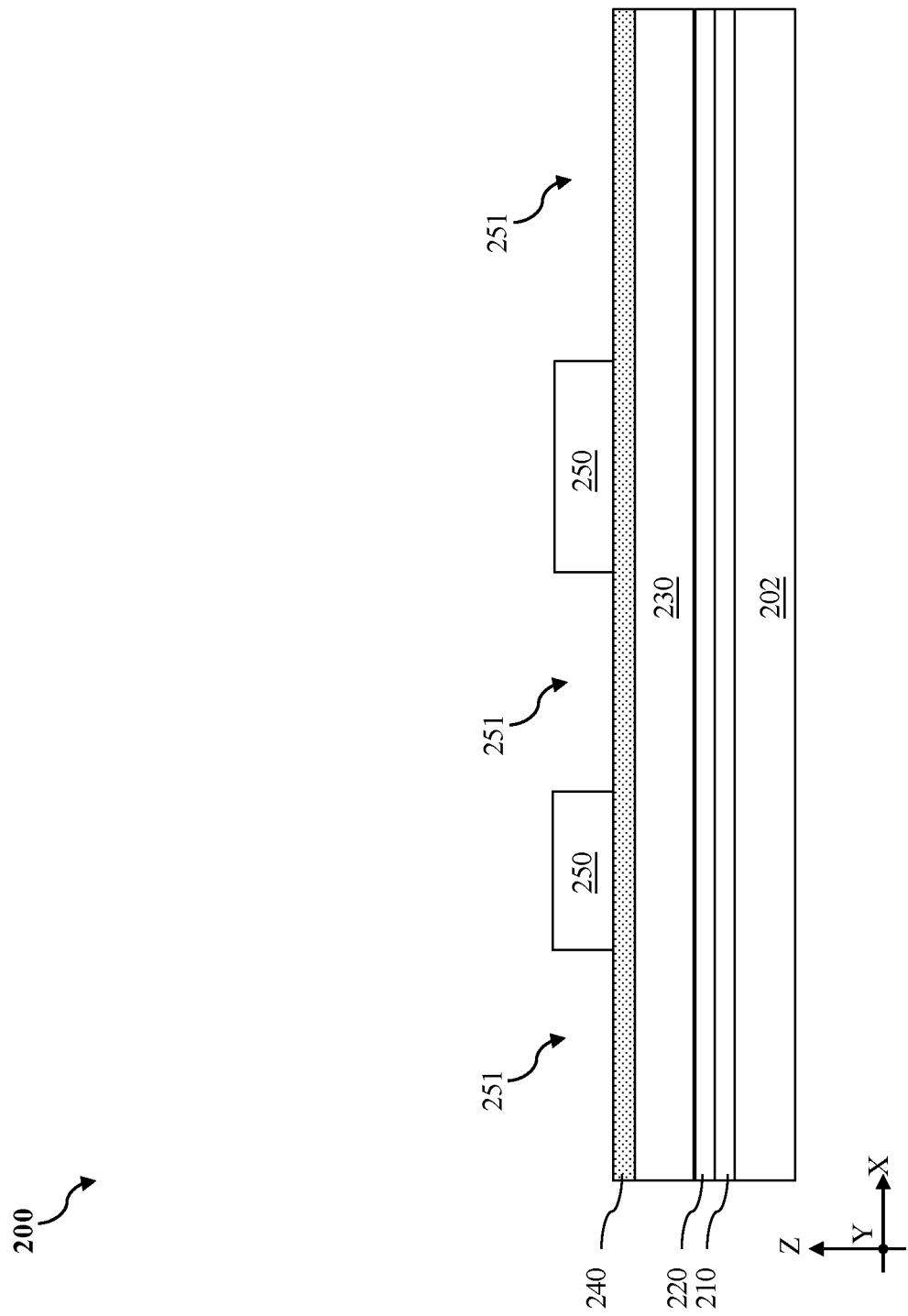

The first dielectric layer 250 is then patterned to form trenches 251. In some implementations, patterning the first dielectric layer 250 involves multiple processes. As illustrated in FIG. 3, a silicon oxynitride (SiON) layer 252 is deposited on the first dielectric layer 250. In some embodiments, a thickness of the SiON layer 252 is between about 54 nm and about 66 nm. As shown in FIG. 4, the SiON layer 252 is patterned, for example, using a photolithography process. As shown in FIG. 5, the first dielectric layer 250 is etched to form trenches 251 therein using the SiON layer 252 as an etch mask. As shown in FIG. 6, the SiON layer 252 is removed after being used as an etch mask, leaving behind a patterned first dielectric layer 250.

Figure 7:
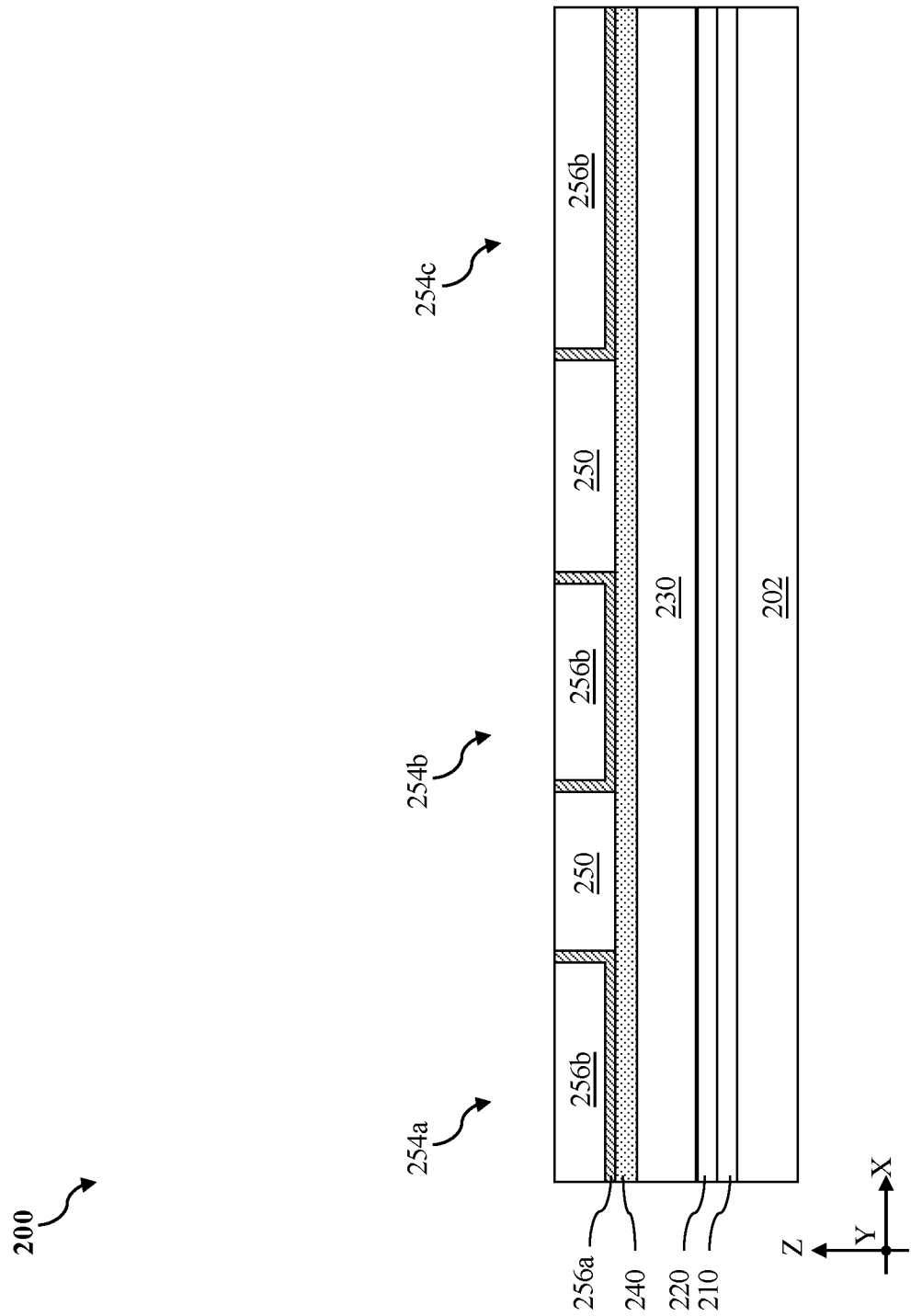

As shown in FIG. 7, one or more lower contact features (such as 254ba, 254b, and 254c) are formed in the trenches 251 of the first dielectric layer 250. Although the lower contact features 254ba, 254b, and 254c are disposed below upper contact features (to be discussed below), the lower contact features 254ba, 254b, and 254c are sometimes referred to as top metal (TM) contacts because they may reside above transistor features (not shown in figures herein). Each of the lower contact features 254ba, 254b, and 254c may include a barrier layer 256a and a metal fill layer 256b. Forming the lower contact features 254ba, 254b, and 254c involves multiple processes. In some embodiments, a barrier layer 256a is formed in each of the trenches 251, followed by the deposition of a metal fill layer 256b over the barrier layer 256a in the trenches. In some embodiments, the barrier layer 256a includes titanium nitride, tantalum, tantalum nitride, or combinations thereof. In some embodiments, the metal fill layer 256b includes a metal or metal alloy such as copper, cobalt, nickel, aluminum, tungsten, titanium, or combinations thereof. In an embodiment, the metal fill layer 256b is formed of copper. In some embodiments, the metal fill layer 256b is formed by deposition or plating, followed by a chemical mechanical planarization (CMP) process. In an embodiment, about 5% to about 10% of the thickness of the metal fill layer 256b is also removed by the CMP process.

Figure 8:
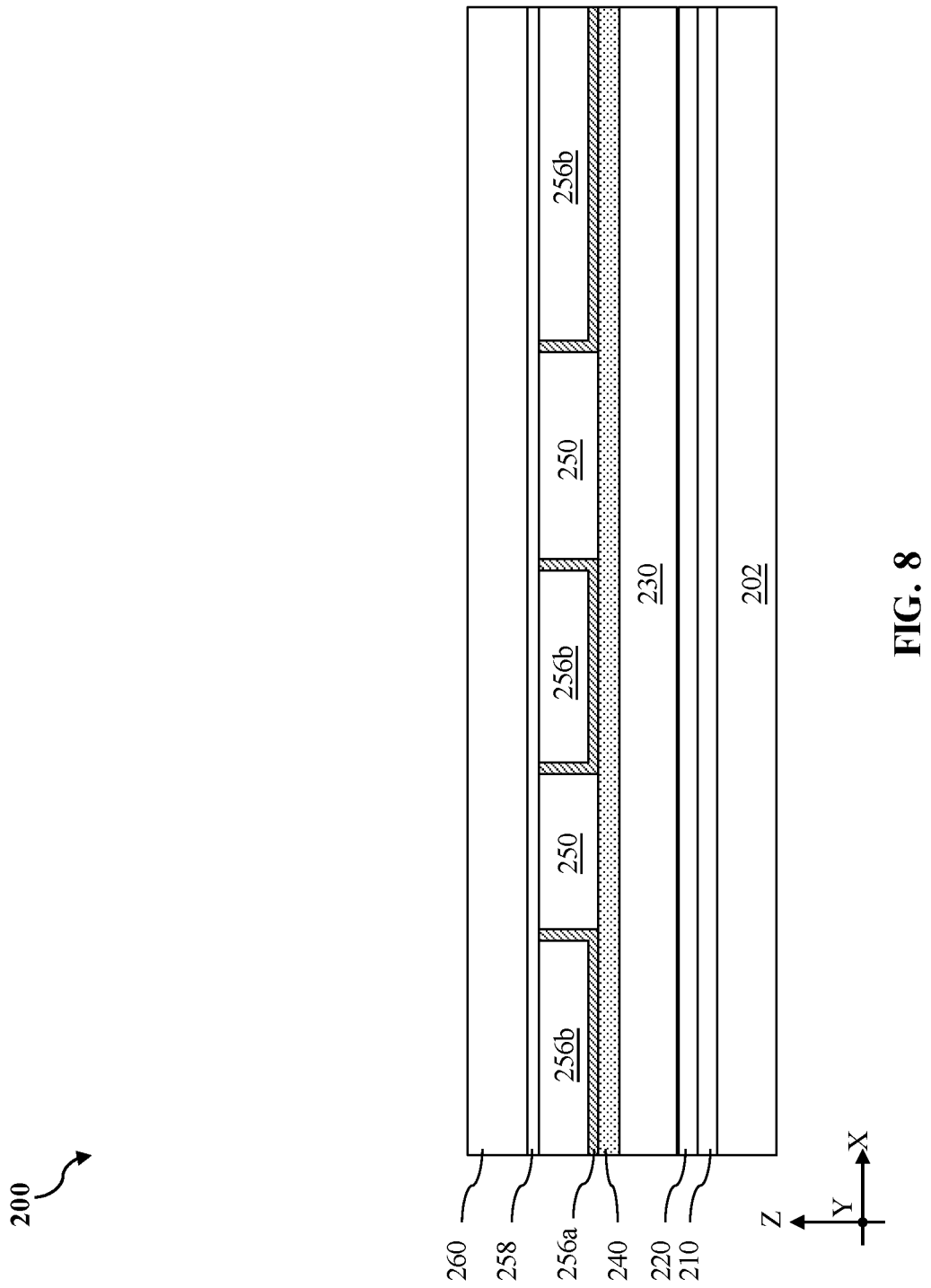

As shown in FIG. 8, a second dielectric layer 258 is deposited over the lower contact features 254ba, 254b, and 254c. In some embodiments, a thickness of the second dielectric layer 258 is about 65 nm and about 85 nm. The second dielectric layer 258 may include silicon carbonitride (SiCN), silicon nitride (SiN), and/or or other suitable materials that may protect the lower contact features 254ba, 254b, and 254c from being oxidized. Also, at block 12, a third dielectric layer 260 is deposited over the second dielectric layer 258. In some embodiments, a thickness of the third dielectric layer 260 is between about 300 nm and about 500 nm. The third dielectric layer 260 may include an oxide material, such as undoped silica glass (USG), or other suitable material(s).

Referring to FIGS. 1 and 9-21, method 10 includes blocks 14-22 where a resistor 271a and a metal-insulator-metal (MIM) structure 271b (shown in FIGS. 20-21) are formed over the third dielectric layer 260. As shown in FIGS. 9-21, forming the resistor 271a and the MIM structure 271b involves multiple processes, including those for formation and patterning of a bottom conducive layer 262, a middle conducive layer 266, and a top conducive layer 270.

Figure 9:
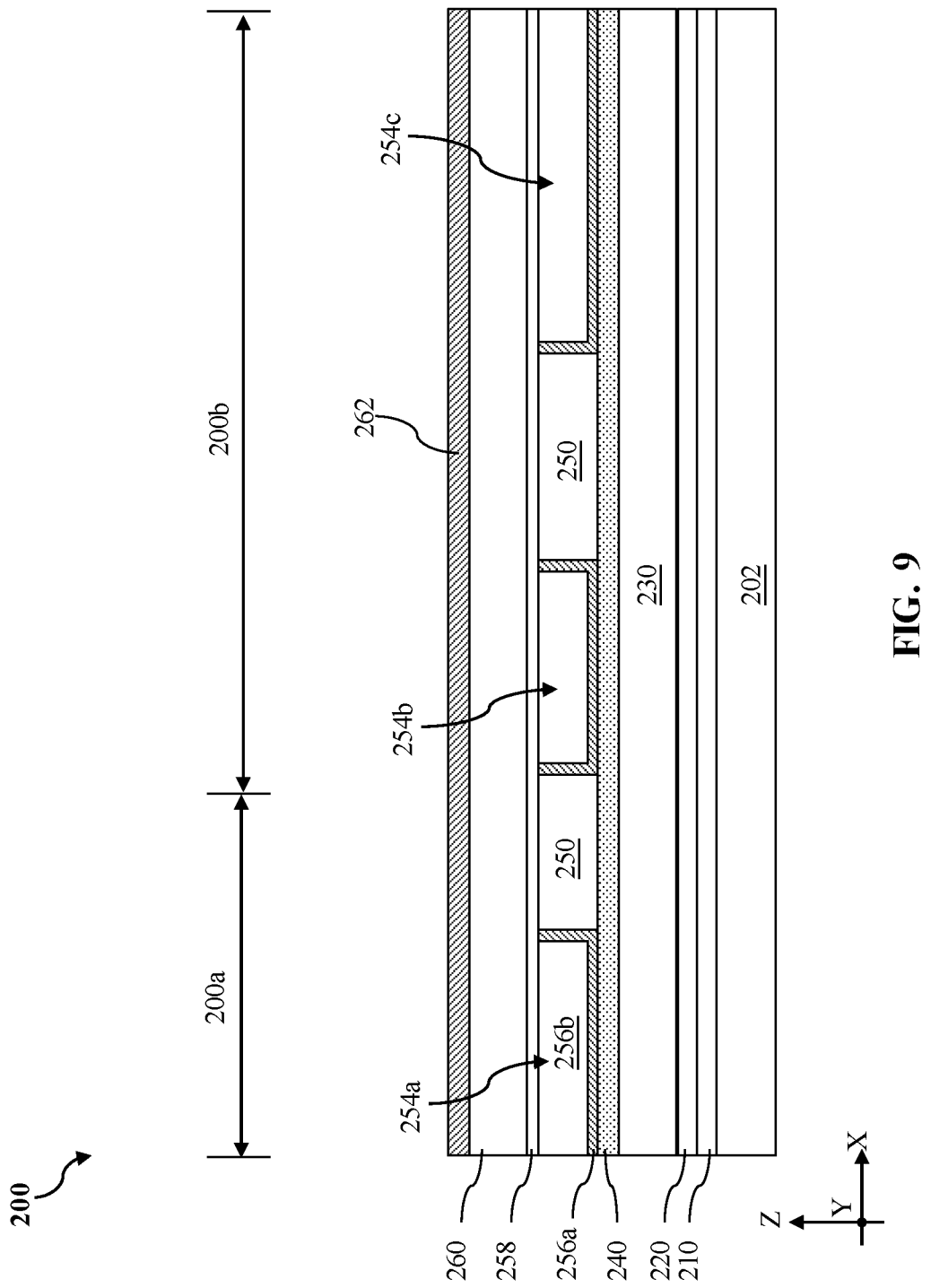

More specifically, referring to FIG. 9, a bottom conductive layer 262 is formed over the substrate in a resistor region 200a and a capacitor region 200b. In some embodiments, the bottom conductive layer 262 may be formed by performing a deposition process (e.g., a CVD process, a PVD process or an ALD process). In some embodiments, a thickness of the bottom conductive layer 262 is between about 30 nm and about 80 nm, such as between about 35 nm and about 45 nm.

In some embodiments, the bottom conductive layer 262 may be made of metals. For example, the bottom conductive layer 262 may made of aluminum, copper, tungsten, or another applicable material. In some embodiments, to substantially prevent or reduce electro-migration and oxygen diffusion, materials of forming the MIM structure's conductive plates (e.g., the bottom conductive plate 262b formed with reference to FIG. 10, the middle conductive plate 266c formed with reference to FIG. 16, and the top conductive plate 270 formed with reference to FIG. 19) may include a transition metal or a transition metal nitride such as titanium, tantalum, titanium nitride, or tantalum nitride. In this depicted example, to further provide the MIM structure 271b with a high switching frequency, the materials of the bottom conductive layer 262, middle conductive layer 266 and top conductive layer 270 used to form the corresponding conductive plates 262b, 266c and 270 in the MIM structure 271b include titanium nitride.

Figure 10:
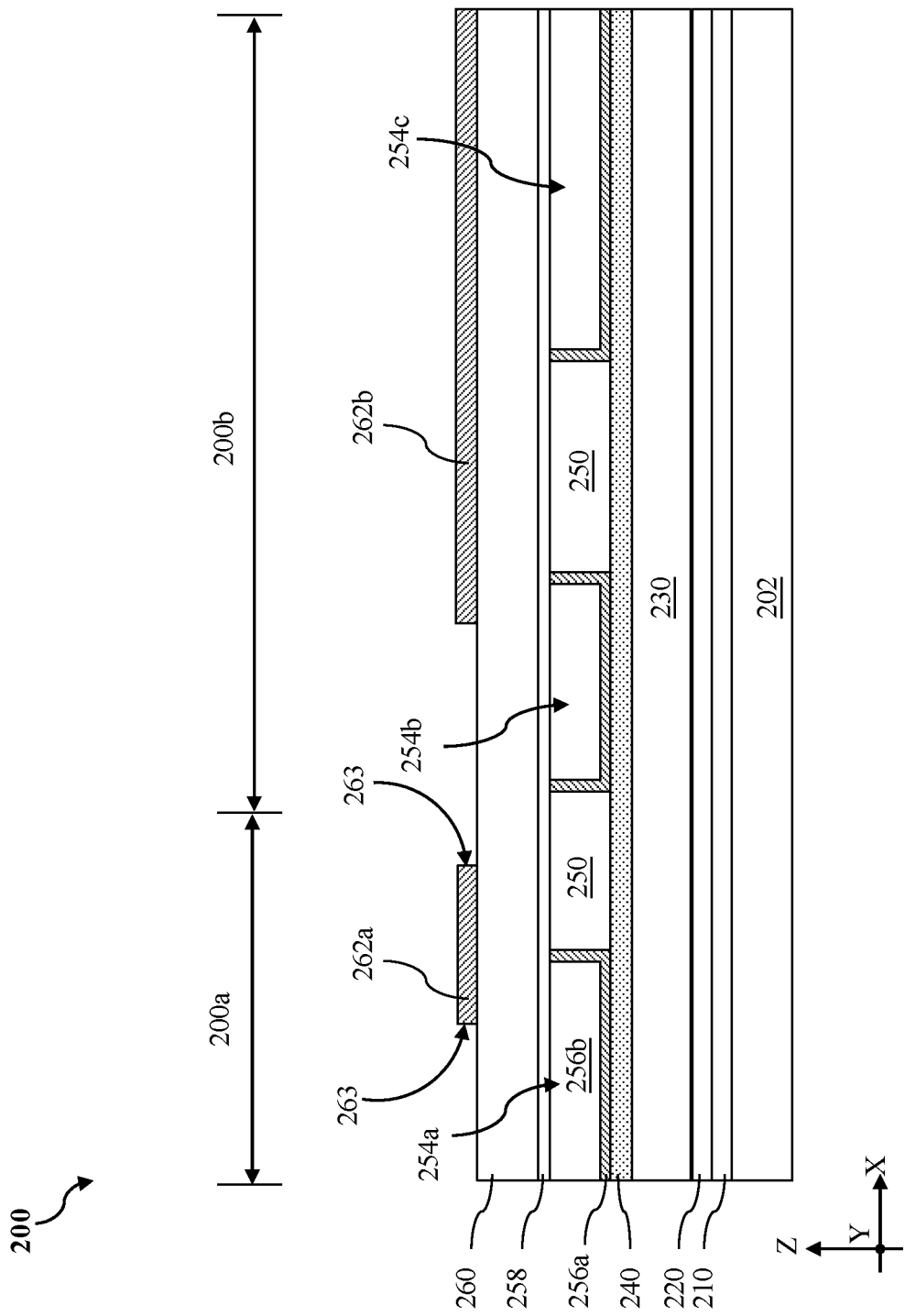

Referring to FIGS. 1 and 10, method 10 includes a block 14 where a patterning process (e.g., a photolithography process and a subsequent etch process) is performed on the bottom conductive layer 262 to form a conductive feature 262a in the resistor region 200a and a bottom conductive plate 262b in the capacitor region 200b. The patterning process may be conducted by using, for example, lithography technology that employs wavelengths range from about 190 nm to about 250 nm.

Figure 11:
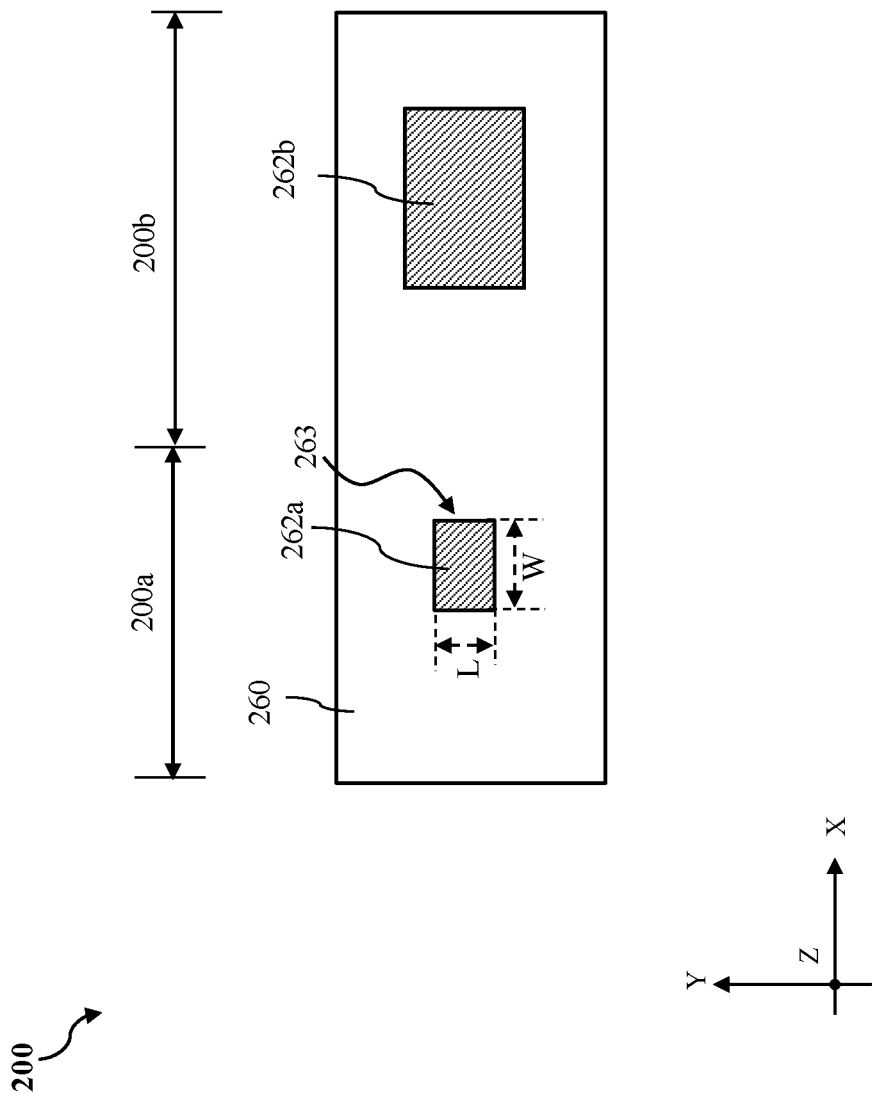
FIGS. 11 and 14-15 are top views of a portion of the workpiece undergoing the method according to various aspects of the present disclosure.

An exemplary top view of the corresponding workpiece is shown in FIG. 11. In this depicted example, as shown in FIG. 11, the conductive feature 262a is patterned to have a quadrilateral shape with four sidewalls 263. As described below in detail, the shape of the conductive feature 262a may potentially affect a length of a to-be-formed conductive line and thus the resistance of the to-be-formed resistor 271a (shown in FIG. 15). Other exemplary shapes of the conductive feature 262a are discussed in further detail with reference to FIGS. 34A, 35A, and 36A. In some implementations, a width W (along the X direction) of the conductive feature 262a may be between about 10 um and about 30 um, and thus the conductive feature 262a may be formed without employing a high-resolution lithography (e.g., Extreme Ultraviolet (EUV) Lithography). A length L (along the Y direction) of the conductive feature 262a may be between about 50 um and 500 um. A corresponding resistance of the to-be-formed resistor 271a (shown in FIG. 15) may be greater than 1000Ω. It is understood by one of ordinary skill in the art that the width W and/or length L of the conductive feature 262a may be adjusted to obtain conductive lines (e.g., conductive lines 266a and 266b shown in FIG. 15) with a different spacing and/or different resistance.

Figure 12:
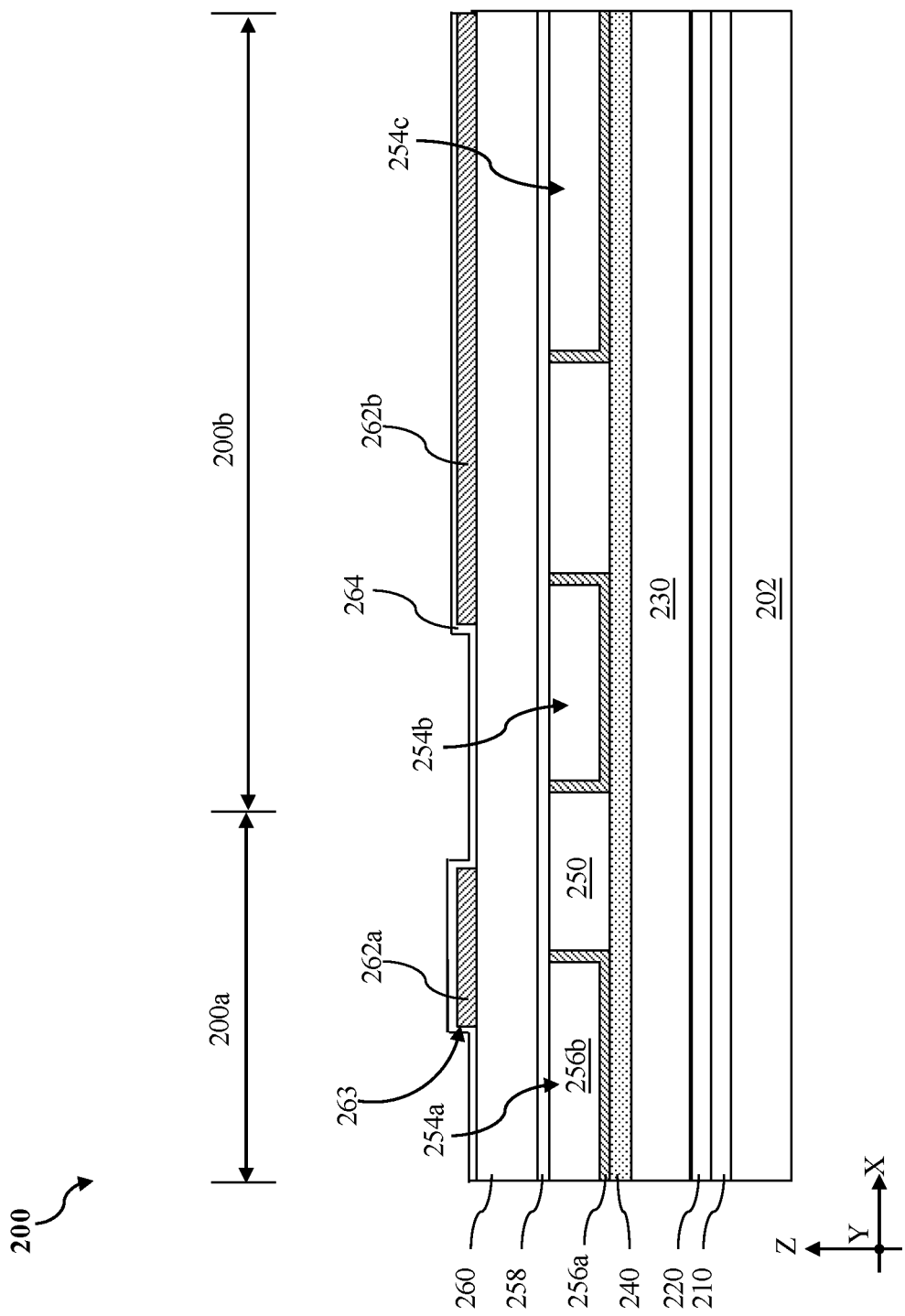

Referring to FIGS. 1 and 12, method 10 includes a block 16 where a first insulator layer 264 is formed on the conductive feature 262a and the bottom conductive plate 262b. In an embodiment, the first insulator layer 264 is conformally deposited to have a generally uniform thickness over the top surface of the workpiece 200 (e.g., having substantially the same thickness on top and sidewall surfaces of the conductive feature 262a and the bottom conductive plate 262b) and covers the sidewalls 263 of the conductive feature 262a.

Figure 13:
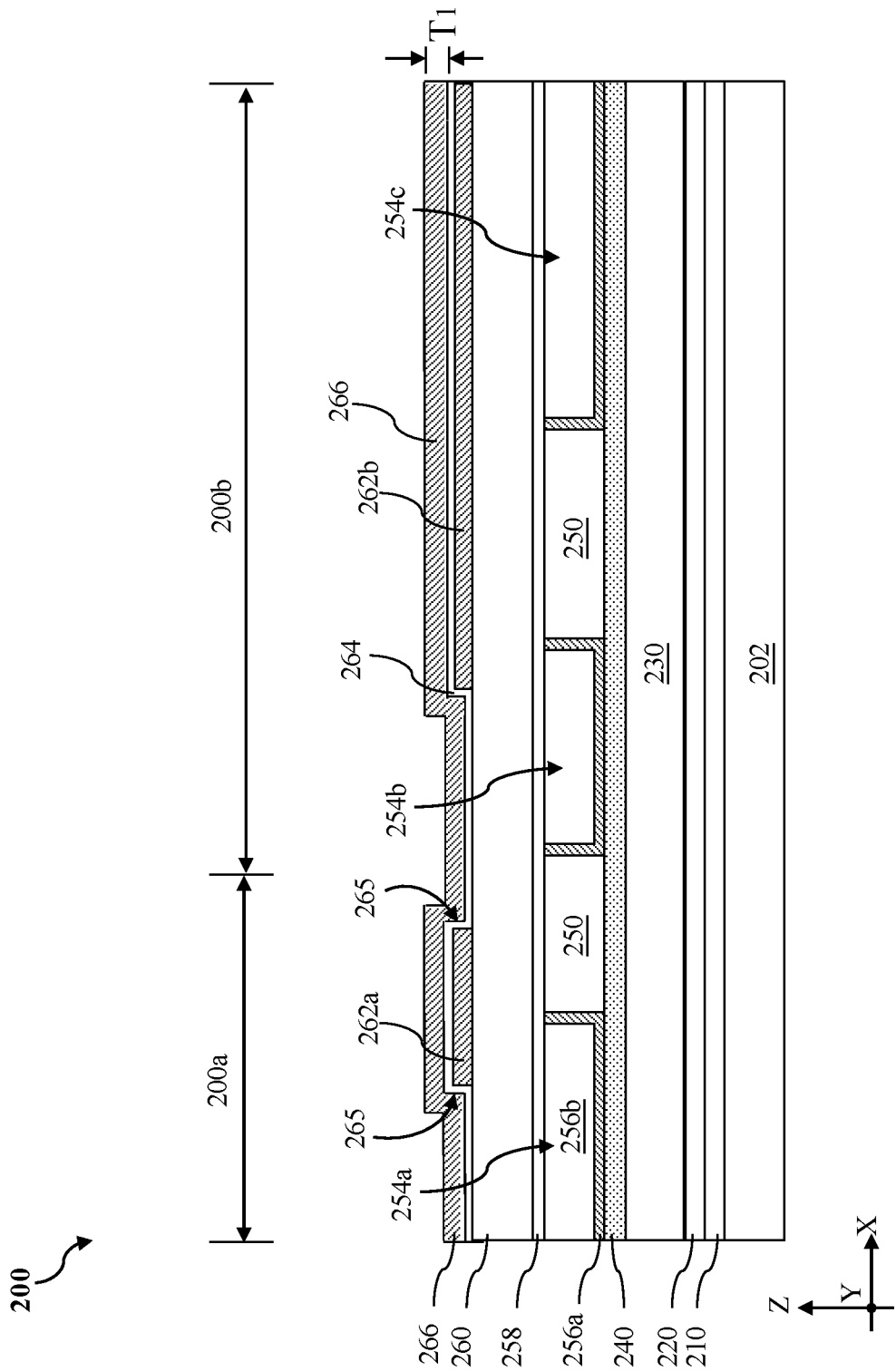

Referring to FIGS. 1 and 13, method 10 includes a block 18 where a middle conductive layer 266 is formed on the first insulator layer 264. In this depicted example, the middle conductive layer 266 is conformally deposited to have a generally uniform thickness $T_1$ over the top surface of the workpiece 200 (e.g., having substantially the same thickness on top and sidewall surfaces of the first insulator layer 264)

and covers the sidewalls 265 of the first insulator layer 264. In some embodiments, the middle conductive layer 266 may be formed by performing a deposition process (e.g., a CVD process, a PVD process or an ALD process).

The material of the middle conductive layer 266 may be same as the material of the bottom conductive layer 262. For example, the middle conductive layer 266 may be made of aluminum, copper, tungsten, titanium, tantalum, titanium nitride, tantalum nitride, or another applicable material. In this depicted example, the middle conductive layer 266 is also formed of titanium nitride. In some embodiments, a thickness of the middle conductive layer 266 is less than 100 nm, for example, between about 30 nm and about 80 nm. In this depicted example, the thickness $T_1$ of the middle conductive layer 266 may be between about 35 nm and about 45 nm.

As described above, forming a resistor on the same substrate with the capacitor may advantageously improve the process integration and reduce cost. Some applications may require resistors with high resistances. As indicated by the equation (1) below, the resistance of a resistor is not only determined by the material of conductive lines used to form the resistor, but also related to the size (e.g., length and cross-sectional area) of the conductive lines. For a given first resistor material, the size of a conductive line can be configured to arrive at resistors of different resistances. Although the resistivity of titanium nitride is lower than, for example, tantalum nitride, a titanium nitride conductive line can be fabricated to have a smaller cross-sectional area and a greater length to achieve a resistance comparable to the tantalum nitride resistor.

$$R = \frac{\rho L}{A} = \frac{\rho L}{WT}, \quad \text{equation (1)}$$

wherein R is the resistance, ρ is the resistivity of the material forming the conductive line, L is the length of the conductive line, A is the cross-sectional area of the conductive line, W is the width of the conductive line, and T is the thickness of the conductive line. As described below in more detail, a resistor according to the present disclosure is formed along with a middle conductive plate of the MIM structure 271b and attains a high resistance without employing a high-resolution lithography (e.g., Extreme Ultraviolet (EUV) Lithography).

Figure 14:
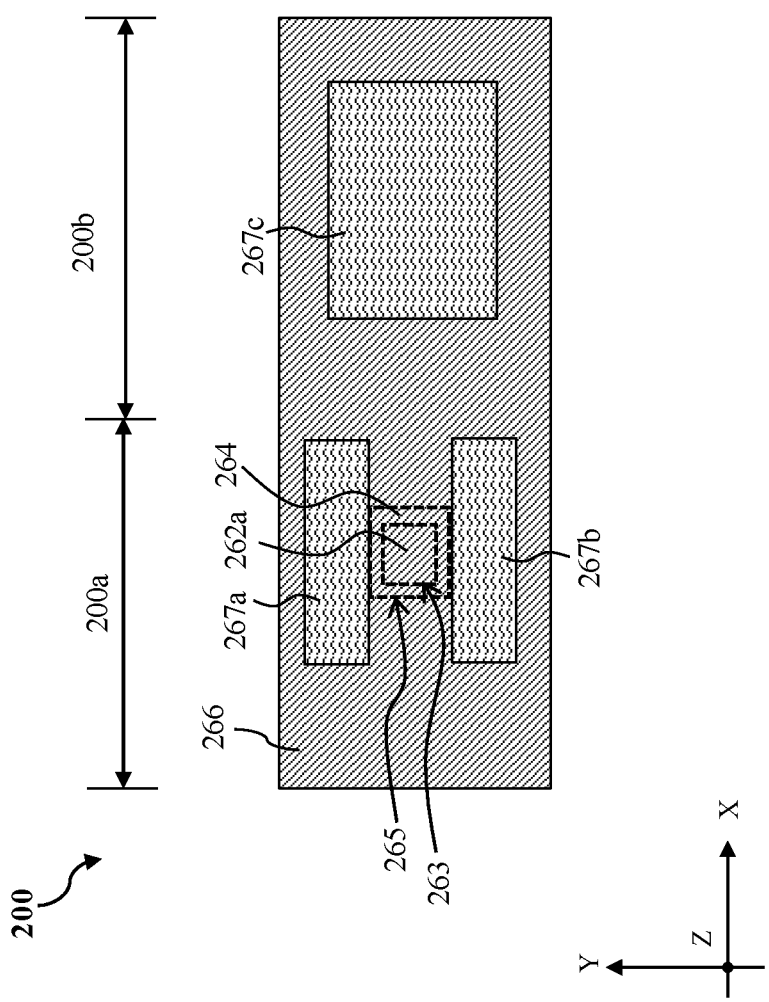

Referring to FIGS. 1 and 14-16, method 10 includes a block 20 where the middle conductive layer 266 is patterned to form a resistor 271a and a middle conductive plate 266c of the MIM structure 271b. More specifically, as shown in FIG. 14, photoresist patterns and/or hard mask patterns 267a, 267b and 267c are formed over the middle conductive layer 266 to cover exemplary three regions (i.e., a first region, a second region, and a third region) of the middle conductive layer 266. In this depicted example, the patterns 267a and 267b extend along two opposing sidewalls 263 of the conductive feature 262a, which is now covered by the first insulator layer 264 and the middle conductive layer 266. While the patterns 267a and 267b in FIG. 14 extend lengthwise along the X direction, they may extend lengthwise along the Y direction in alternative embodiments not explicitly shown in the figures.

After forming the photoresist patterns and/or hard mask patterns 267a, 267b and 267c, an etch process (not shown) is performed to remove the uncovered middle conductive layer 266 (e.g., portions of middle conductive layer 266 that are not covered by the photoresist patterns and/or hard mask patterns 267a, 267b and 267c). For example, the portion of the middle conductive layer 266 that is directly over the conductive feature 262a is removed. The portion of the middle conductive layer 266 that is disposed between the resistor 271a and the middle conductive plate 266c is also removed. In some embodiments, the etch process may include a dry etch process and may be anisotropic. In some embodiments, the first insulator layer 264 may be used as an etch stop layer during this etch process.

Figure 15:
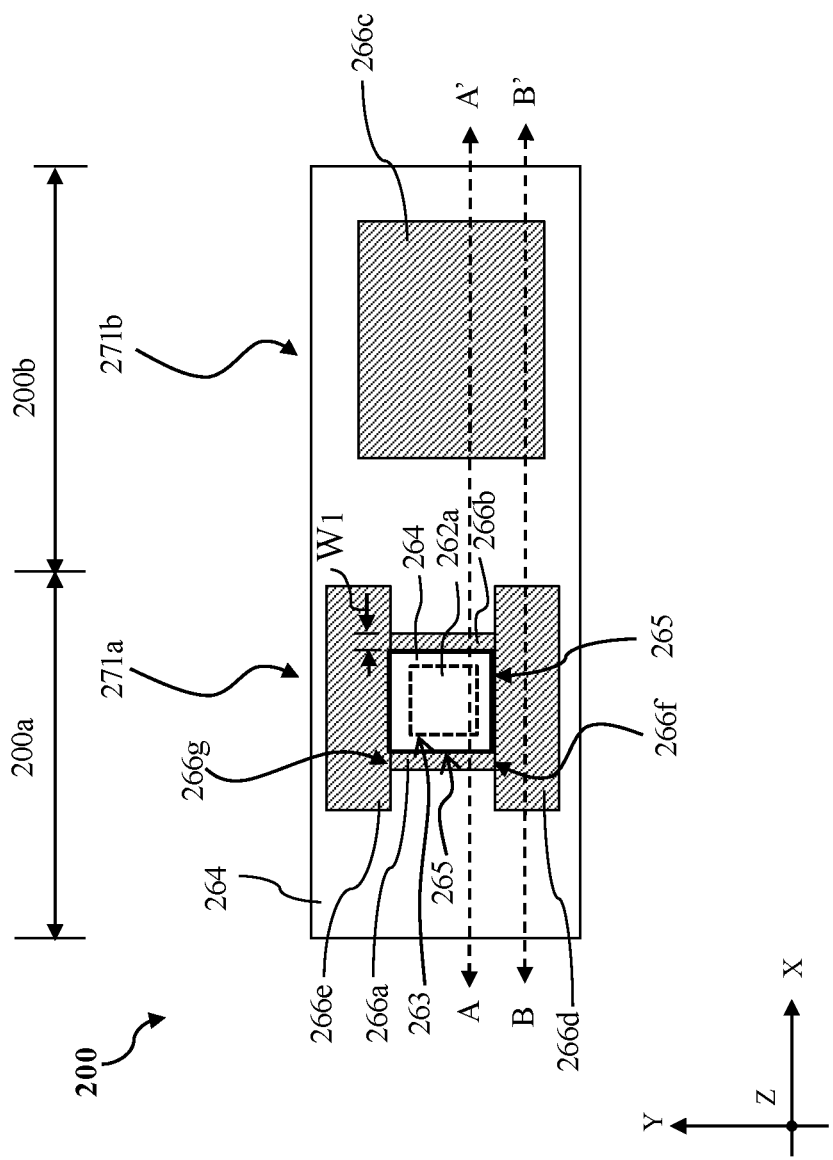

An exemplary top view of the workpiece 200 after undergoing the above etch process is shown in FIG. 15. After the etch process, the previously covered first region and second region (i.e., regions covered by the patterns 267a and 267b shown in FIG. 14) of the middle conductive layer 266 may function as a first electrode 266d and a second electrode 266e of the resistor 271a, respectively. In this depicted example, the first electrode 266d and the second electrode 266e extend lengthwise along the X direction.

Still referring to FIG. 15, after the etch process, a first conductive line 266a is formed over and extending along a first sidewall of the conductive feature 262a, and a second conductive line 266b is formed over and extending along a second sidewall the conductive feature 262a. The first conductive line 266a and the second conductive line 266b are spaced apart from and insulated from the conductive feature 262a by the first insulator layer 264. In this depicted example, the first conductive line 266a and the second conductive line 266b are along the Y direction. The two conductive lines 266a and 266b extend between the first electrode 266d and the second electrode 266e and each of the conductive lines 266a and 266b has a proximal end 266f and a distal end 266g. The first electrode 266d directly contacts the proximal ends 266f of the conductive lines 266a and 266b, and the second electrode 266e directly contacts the distal ends 266g of the conductive lines 266a and 266b. Because the two conductive lines 266a and 266b are coupled to the first electrode 266d and the second electrode 266e in parallel, the resistance of the resistor 271a may be one half (½) of the resistance of the conductive line 266a or the conductive line 266b.

As shown in FIG. 15, the length of the first/second conductive line 266a/266b along the Y direction bears a relationship with the length of the conductive feature 262a along the Y direction. The longer the conductive feature 262a along the Y direction, the longer is the length of the first/second conductive line 266a/266b along the Y direction. In some implementations, the length of the first/second conductive line 266a/266b along the Y direction may be substantially equal to a sum of the length L of the conductive feature 262a along the Y direction and twice the thickness of the first insulator layer 264. A distance between the first and second conductive lines 266a-266b along the X direction may be substantially equal to a sum of the width W of the conductive feature 262a along the X direction and twice the thickness of the first insulator layer 264. A width $W_1$ of the first/second conductive line 266a/266b is substantially equal to the deposition thickness $T_1$ of the middle conductive layer 266. In some embodiments, the width $W_1$ of the conductive line 266a/266b is less than 100 nm, for example, about between 30 nm and about 80 nm. In this depicted example, the width $W_1$ of the conductive line 266a/266b may be between about 35 nm and about 45 nm. By forming the first and second conductive lines 266a-266b with small widths along the X direction and a longer length along the Y direction, a high-resistance resistor may be then obtained. In some embodiments, the resistor 271a may provide a resistance ranged from about 500Ω to about 5 MΩ, for example.

Figure 16:
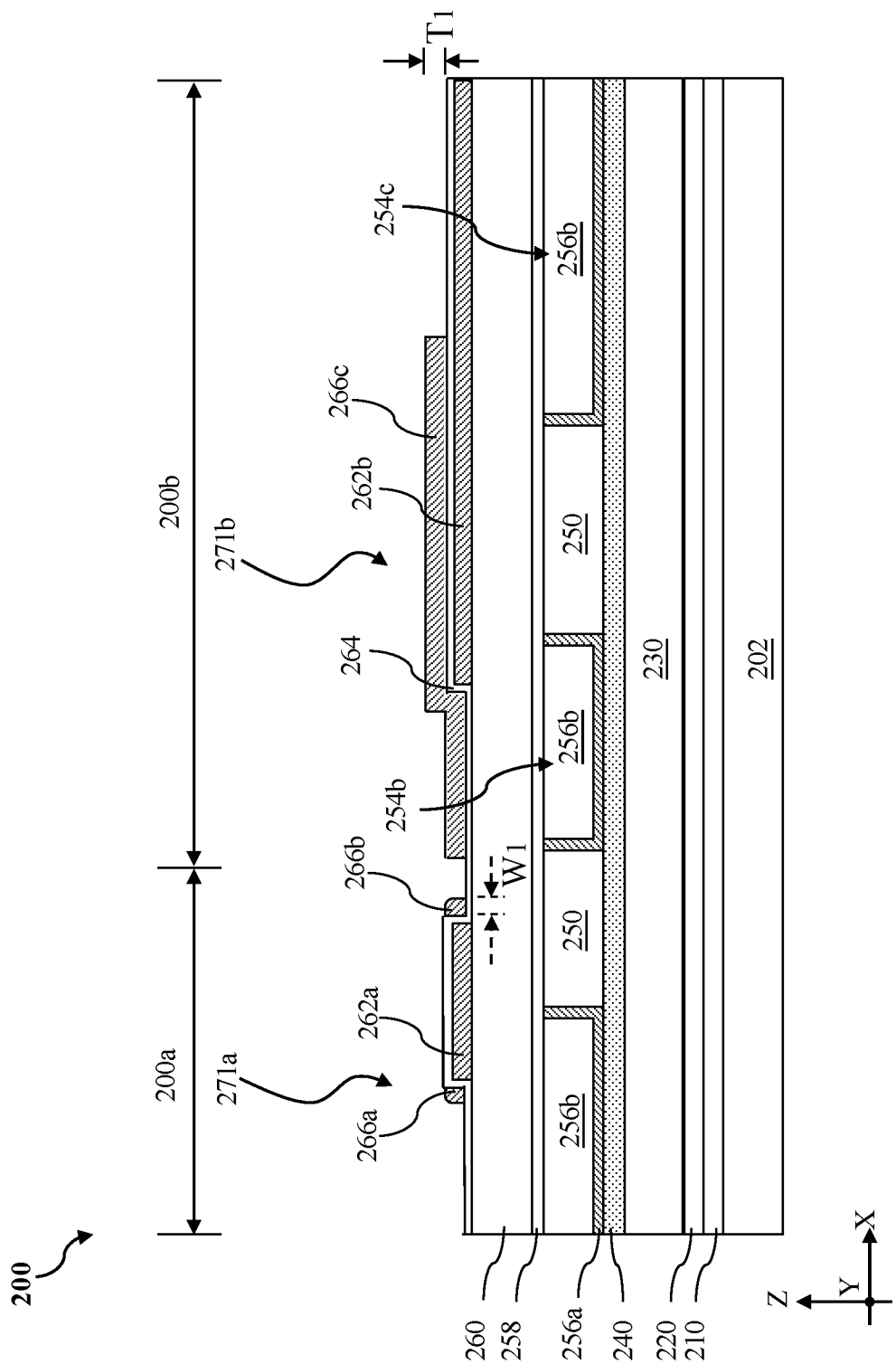

In addition, still referring to FIG. 15, the previously covered third region (i.e., the region covered by the pattern 267c shown in FIG. 14) of the middle conductive layer 266 functions as a middle conductive plate 266c of the MIM structure 271b. Thus, without applying a high-resolution lithography, sidewall spacers (e.g., conductive lines 266a and 266b shown in FIG. 16) with small widths $W_1$ may be formed at two parallel sidewalls of the first insulator layer 264. In other words, formation of the conductive lines 266a and 266b does not require forming a photoresist pattern that selectively exposes or covers the areas where the of the conductive lines 266a and 266b are formed. An exemplary cross-sectional view of the workpiece 200 taken along line A-A' after the etch process is shown in FIG. 16.

As discussed with reference to FIGS. 13-16, the conductive lines 266a-266b and the electrodes 266d-266e of the resistor 271a are formed in the same patterning process (e.g., a photolithography process and the subsequent etch process) and formed of the same material. More particularly, in this depicted example, the resistor 271a is formed of the same material as the middle conductive plate 266c by simultaneously patterning the middle conductive layer 266.

As stated with reference to the equation (1), besides material and cross-sectional area, the resistance of the resistor 271a is also a function of the lengths of the conductive lines 266a and 266b. As discussed with references to FIGS. 10-15, the lengths of the conductive lines 266a and 266b are functions of the shape and size of the sidewalls 265 of the first insulator layer 264 and thus functions of the shape and size of the sidewalls 263 of the conductive feature 262a. Thus, by configuring the shape and size of the conductive feature 262a, resistance of the resistor 271a may be configured accordingly. In this depicted example of forming the resistor 271a, as shown in FIG. 11, the conductive feature 262a is patterned to have a quadrilateral shape. Other exemplary shapes of the conductive feature 262a and corresponding shapes of the conductive lines 266a-266b are discussed in further detail with reference to FIGS. 34A-34B, 35A-35B, and 36A-36B.

Figure 17:
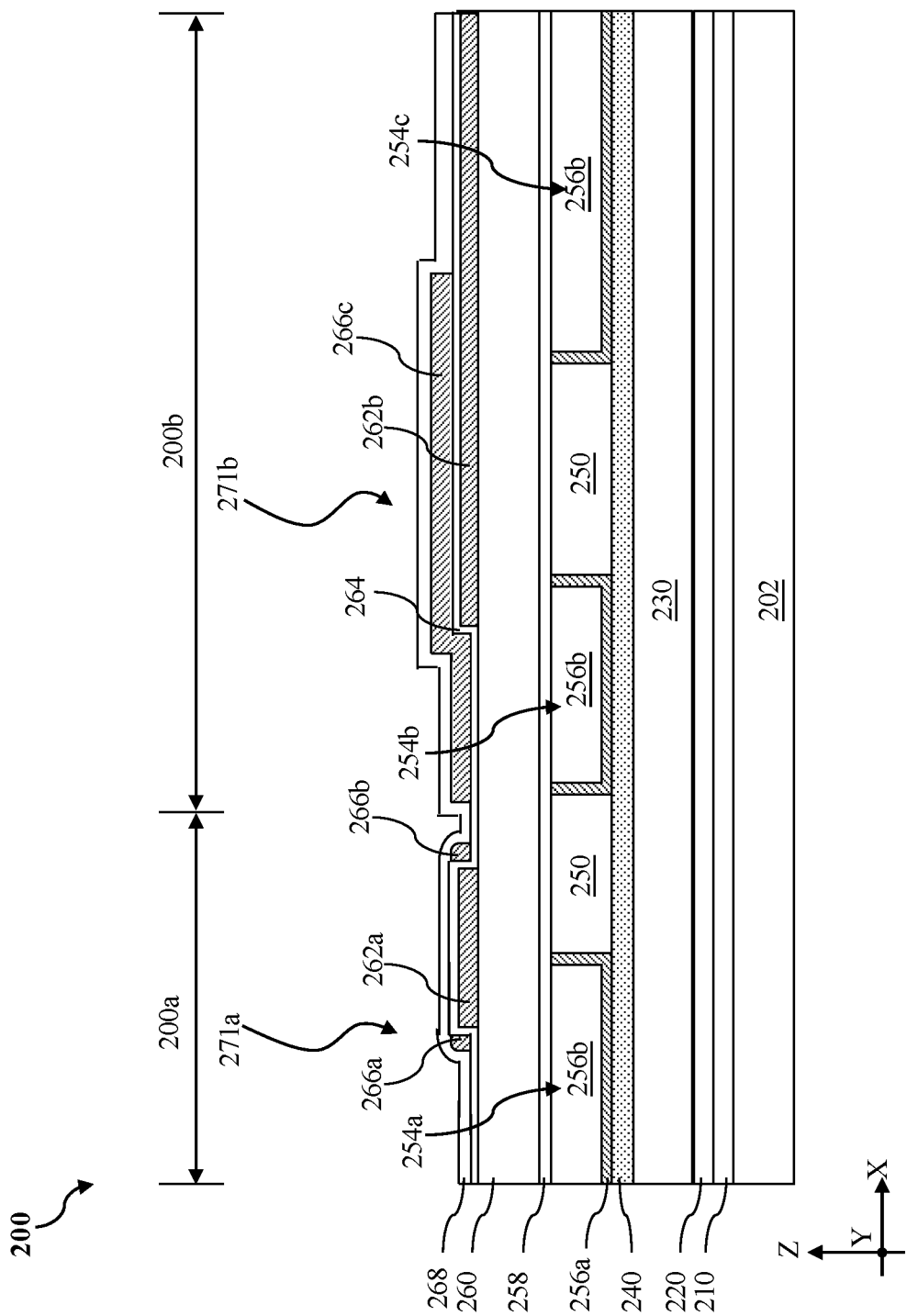
Figure 18:
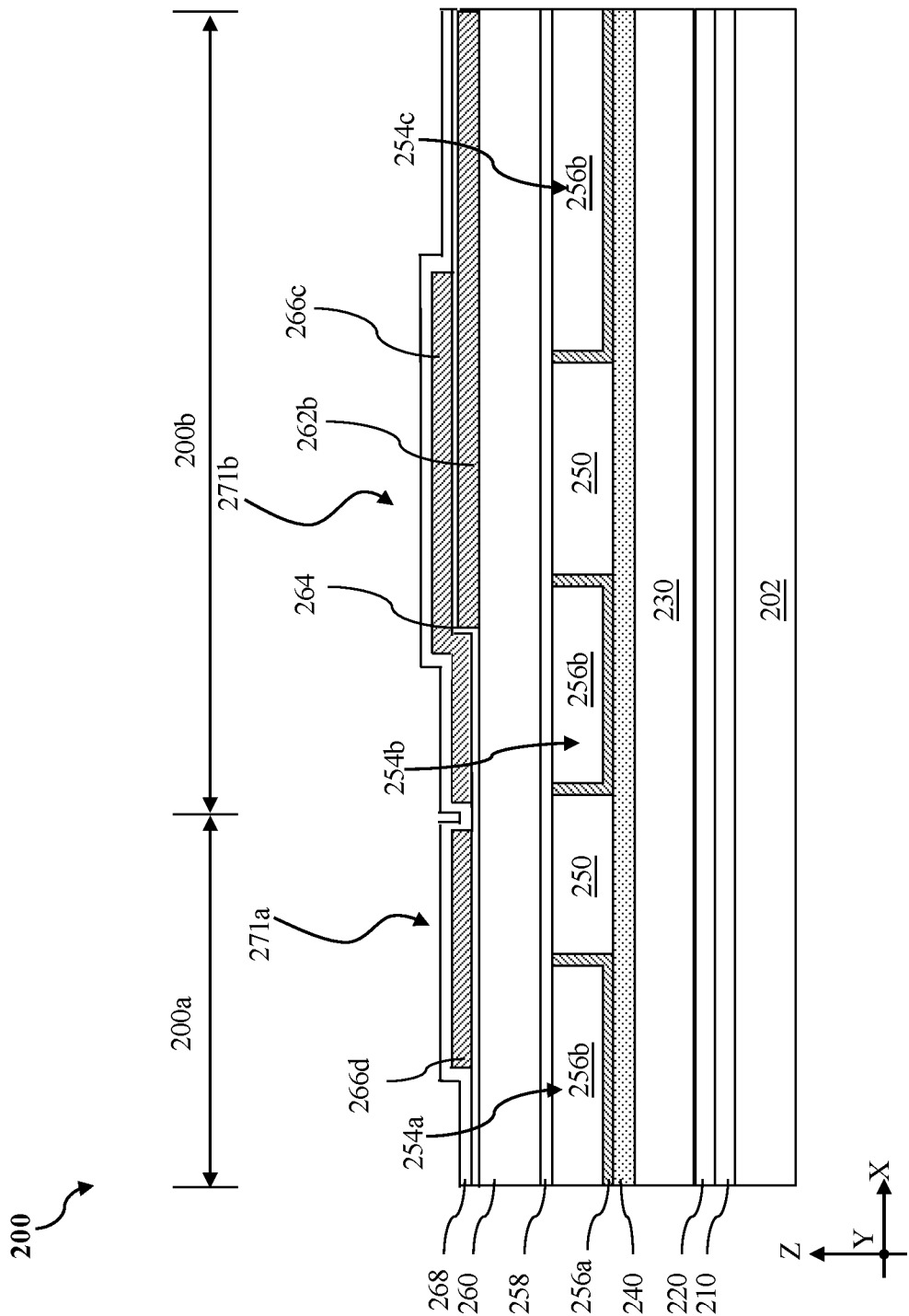

Referring to FIGS. 1 and 17-19, method 10 includes a block 22 where a second insulator layer 268 and a top conductive plate 270 are formed over the workpiece. More specifically, the second insulator layer 268 is disposed over the resistor 271a, the middle conductive plate 266c, and portions of the first insulator layer 264 (e.g., portions of the first insulator layer 264 that are not covered by the resistor 271a and the middle conductive plate 266c). An exemplary cross-sectional view of the workpiece 200 taken along line A-A' after the deposition of the second insulator layer 268 is shown in FIG. 17. An exemplary cross-sectional view of the workpiece 200 taken along line B-B' after the deposition of the second insulator layer 268 is shown in FIG. 18. In this embodiment, the second insulator layer 268 is conformally deposited to have a generally uniform thickness over the top surface of the workpiece 200 (e.g., having substantially the same thickness on top surfaces of the resistor 271a, the middle conductive plate 266c, and portions of the first insulator layer 264 not covered by the resistor 271a and the middle conductive plate 266c) and covers the sidewalls of the resistor 271a and the middle conductive plate 266c.

After depositing the second insulator layer 268, a patterned top conductive plate 270 is formed over the middle conductive plate 266c in the capacitor region 200b. The top conductive plate 270 may be formed in a way similar to that used to form the bottom conductive plate 262b, but the pattern of the top conductive plate 270 may be different from that of the bottom conductive plate 262b. An exemplary cross-sectional view of the workpiece 200 taken along line A-A' after the formation of the top conductive plate 270 is shown in FIG. 19.

In some embodiments, a thickness of the top conductive plate 270 may be less than 100 nm, for example, between about 30 nm and about 80 nm. In this depicted example, a thickness of the top conductive plate 270 may be between about 35 nm and about 45 nm. The top conductive plate 270 may be formed of the same material to the bottom conductive plate 262b and/or the middle conductive plate 266c. For example, the top conductive plate 270 may be made of aluminum, copper, tungsten, titanium, tantalum, titanium nitride, tantalum nitride, or another applicable material. In this depicted example, the top conductive plate 270 is also formed of titanium nitride. In some embodiments, the top conductive plate 270 may be formed by performing a deposition process (e.g., a CVD process, a PVD process or an ALD process).

Figure 19:
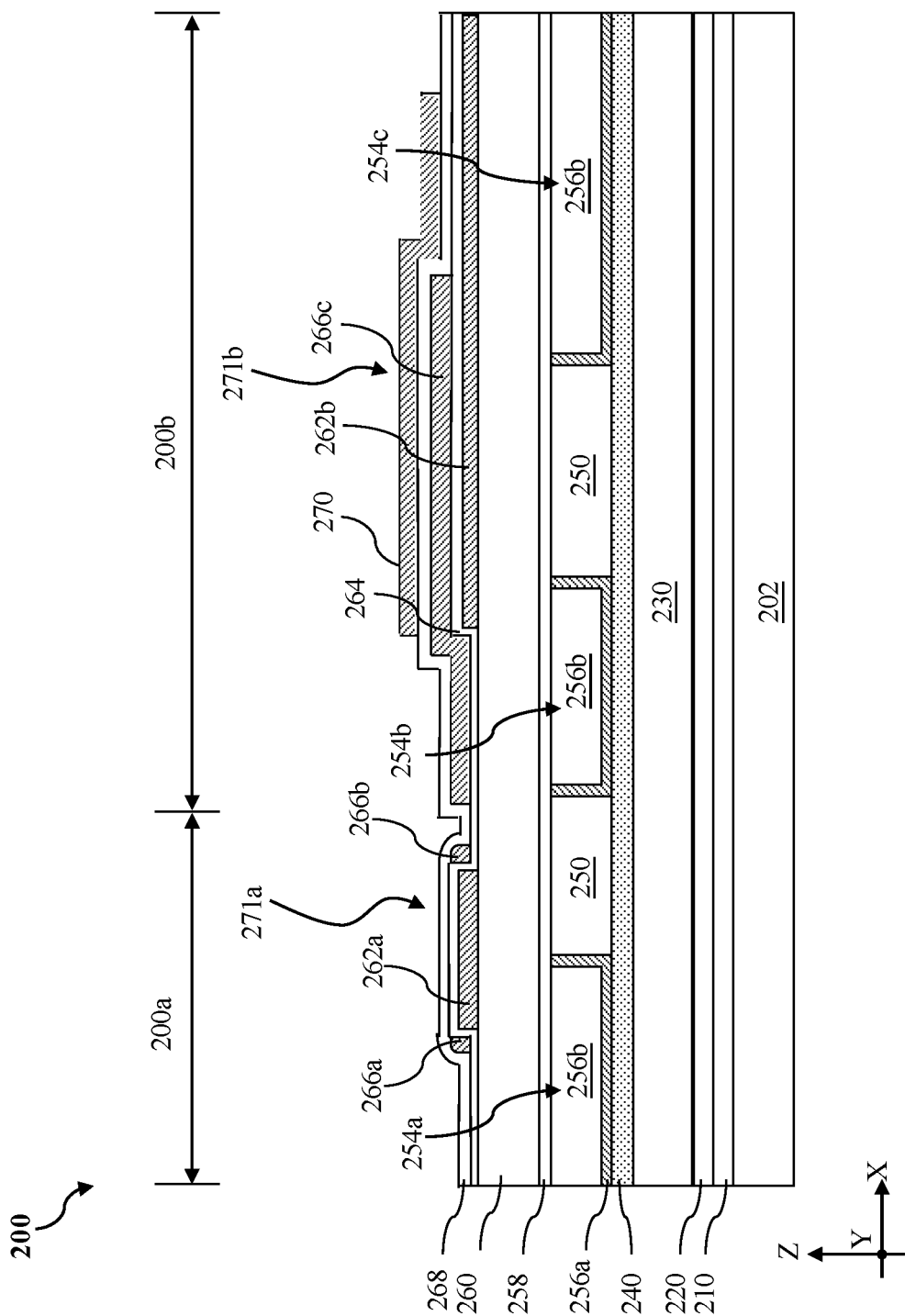

As illustrated in FIG. 19, the MIM structure 271b includes multiple metal layers including the bottom conductive plate 262b, the middle conductive plate 266c, and the top conductive plate 270. The MIM structure 271b also includes multiple insulator layers including the first insulator layer 264 disposed between the bottom conductive plate 262b and the middle conductive plate 266c, as well as the second insulator layer 268 disposed between the middle conductive plate 266c and the top conductive plate 270. The MIM structure 271b is used to implement one or more capacitors, which may be connected to other electric components such as transistors. The multi-layer MIM structure 271b allows capacitors to be closely packed together in both vertical and lateral directions, thereby reducing the amount of lateral space needed for implementing capacitors. As a result, the MIM structure 271b may accommodate super high-density capacitors.

In some embodiments, to increase capacitance values, the first insulator layer 264 and/or the second insulator layer 268 use high-k dielectric material(s) whose k-value is greater than that of silicon oxide. The first and second insulator layers 264 and 268 may be relatively thin to increase capacitance values. However, minimal thicknesses for the first and second insulator layers 264 and 268 are maintained to avoid potential breakdown of the capacitors in the MIM structure 271b (e.g., when two capacitor plates have high potential difference, current may leak between the plates, causing breakdown). In some embodiments, each of the first and second insulator layers 264 and 268 is about 4 nm to about 20 nm thick, such as between about 4 nm and about 10 nm. In some implementations, each of the first insulator layer 264 and the second insulator layer 268 may be formed of zirconium oxide ($ZrO_2$), hafnium oxide ($HfO_2$), aluminum oxide ($Al_2O_3$), tantalum oxide ($TaO_5$), silicon oxide ($SiO_2$), or titanium oxide ($TiO_2$). Further, to optimize the capacitor performance, in some embodiments, the first insulator layer 264 (or the second insulator layer 268) is a tri-layer structure including, from bottom to top, a first zirconium oxide ($ZrO_2$) layer, an aluminum oxide ($Al_2O_3$) layer, and a second zirconium oxide ($ZrO_2$) layer, where each of the layers is about 2 nm to about 5 nm thick. In some embodiments, a total thickness of the $ZrO_2/Al_2O_3/ZrO_2$ (ZAZ) dielectric may range from 4 nm to 10 nm, for example.

Figure 20:
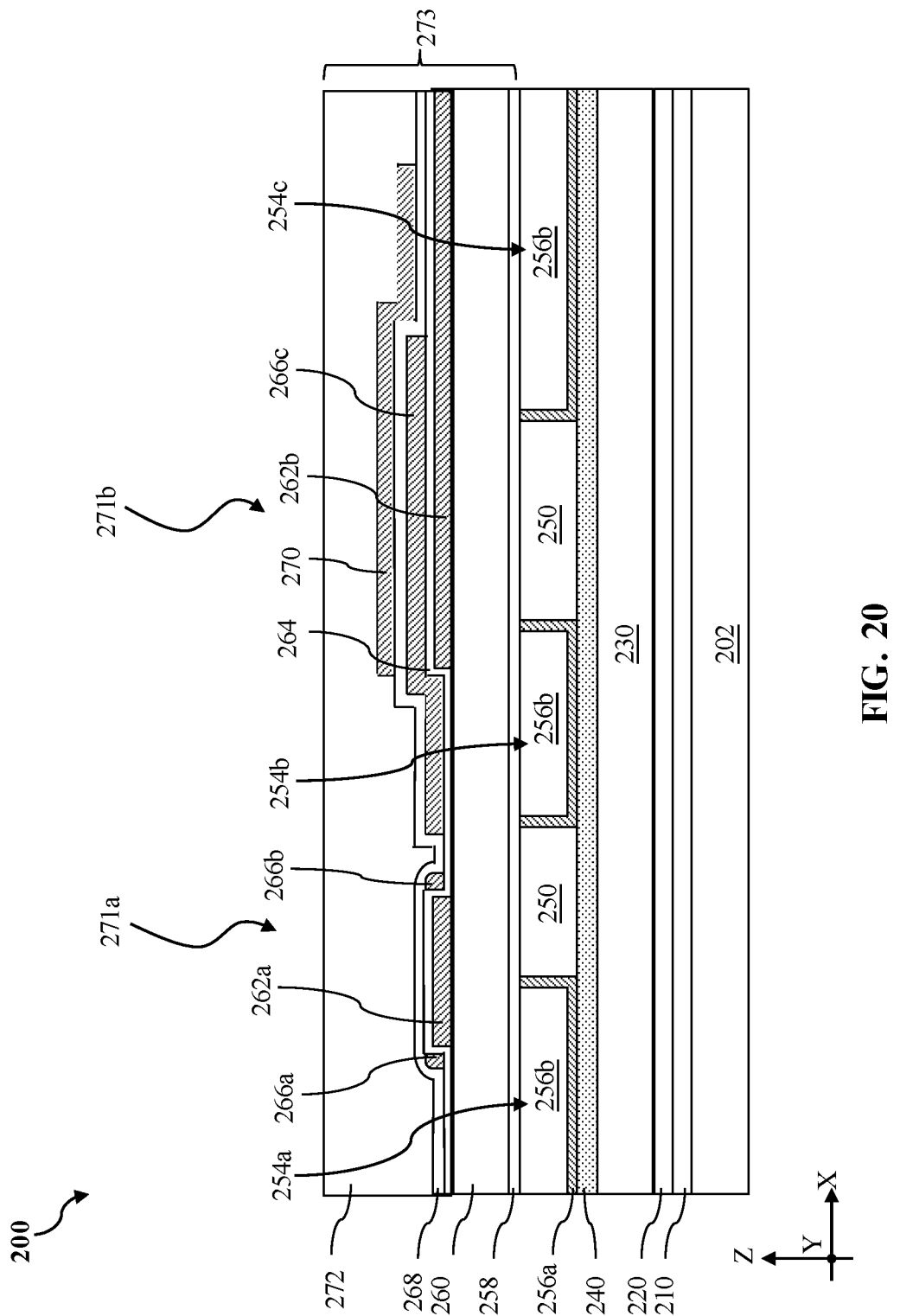
Figure 21:
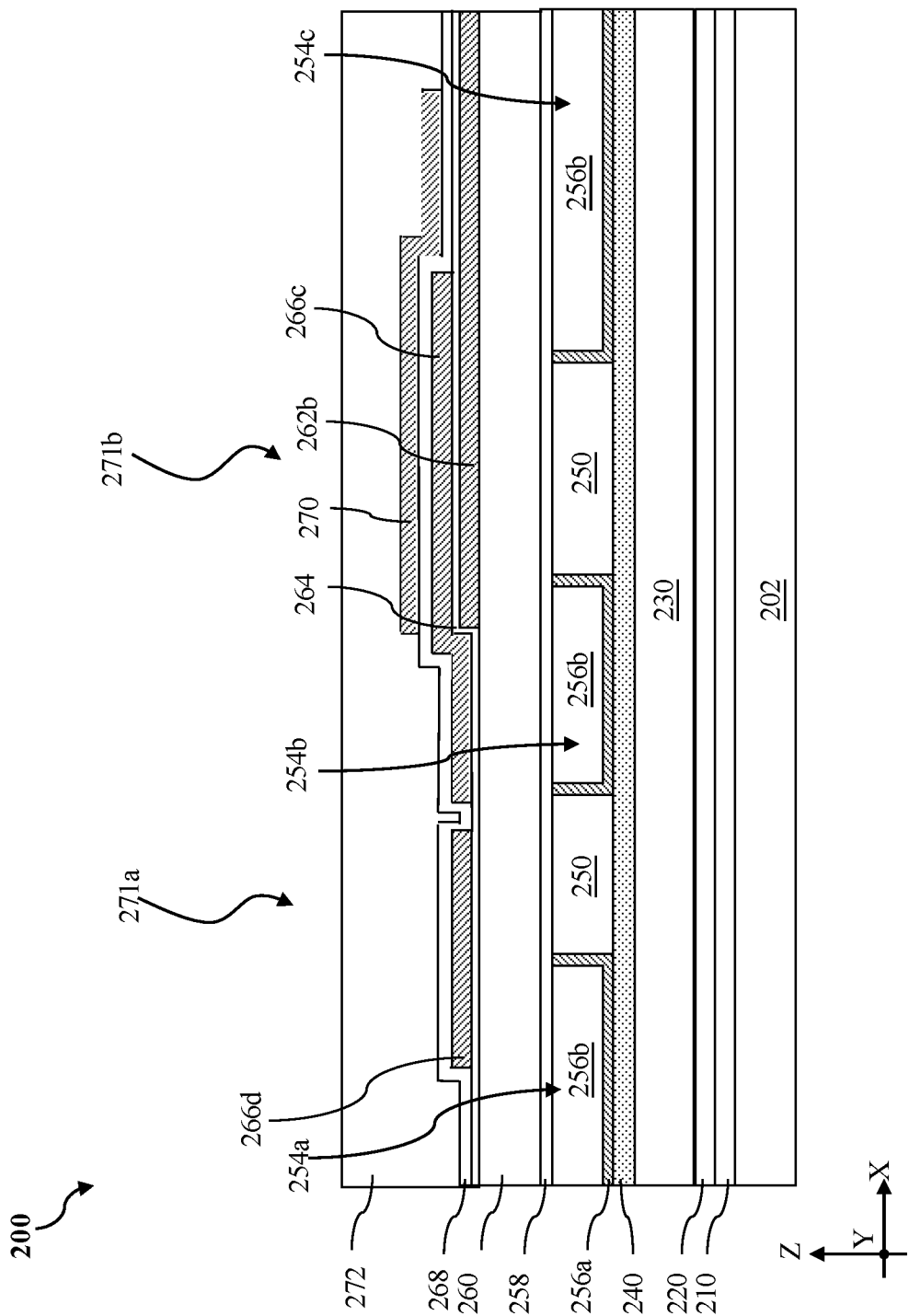

Referring to FIGS. 1 and 20-21, method 10 includes a block 24 where a fourth dielectric layer 272 is deposited over the resistor 271a and the MIM structure 271b. FIG. 20 depicts a cross-sectional view of the workpiece after the formation of the fourth dielectric layer 272 taken along line A-A' in FIG. 15. FIG. 21 depicts a cross-sectional view of the workpiece after the formation of the fourth dielectric layer 272 taken along line B-B' in FIG. 15. In some embodiments, a thickness of the fourth dielectric layer 272 may be between about 400 and about 500 nm. In some embodiments, the fourth dielectric layer 272 may include an oxide material, such as undoped silica glass, or other suitable material(s). In some embodiments, the fourth dielectric layer 272 is formed by depositing about 900 to about 1000 nm of the oxide material, followed by a CMP process to reach the final thickness.

As shown in FIGS. 20-21, the resistor 271a (including the conductive lines 266a-266b and the electrodes 266d-266e) and the MIM structure 271b are sandwiched between the third dielectric layer 260 and the fourth dielectric layer 272, which may have the same material and/or the same thickness. In some embodiments, the second dielectric layer 258, the third dielectric layer 260, the resistor 271a and the MIM structure 271b, and the fourth dielectric layer 272 are regarded as parts of a first multi-layer passivation structure 273. Alternatively, if the resistor 271a and the MIM structure 271b are not present in the passivation structure 273, the third dielectric layer 260 and the fourth dielectric layer 272 may be combined as a single dielectric layer (e.g., about 900 to about 1100 nm thick) over the second dielectric layer 258.

Figure 22:
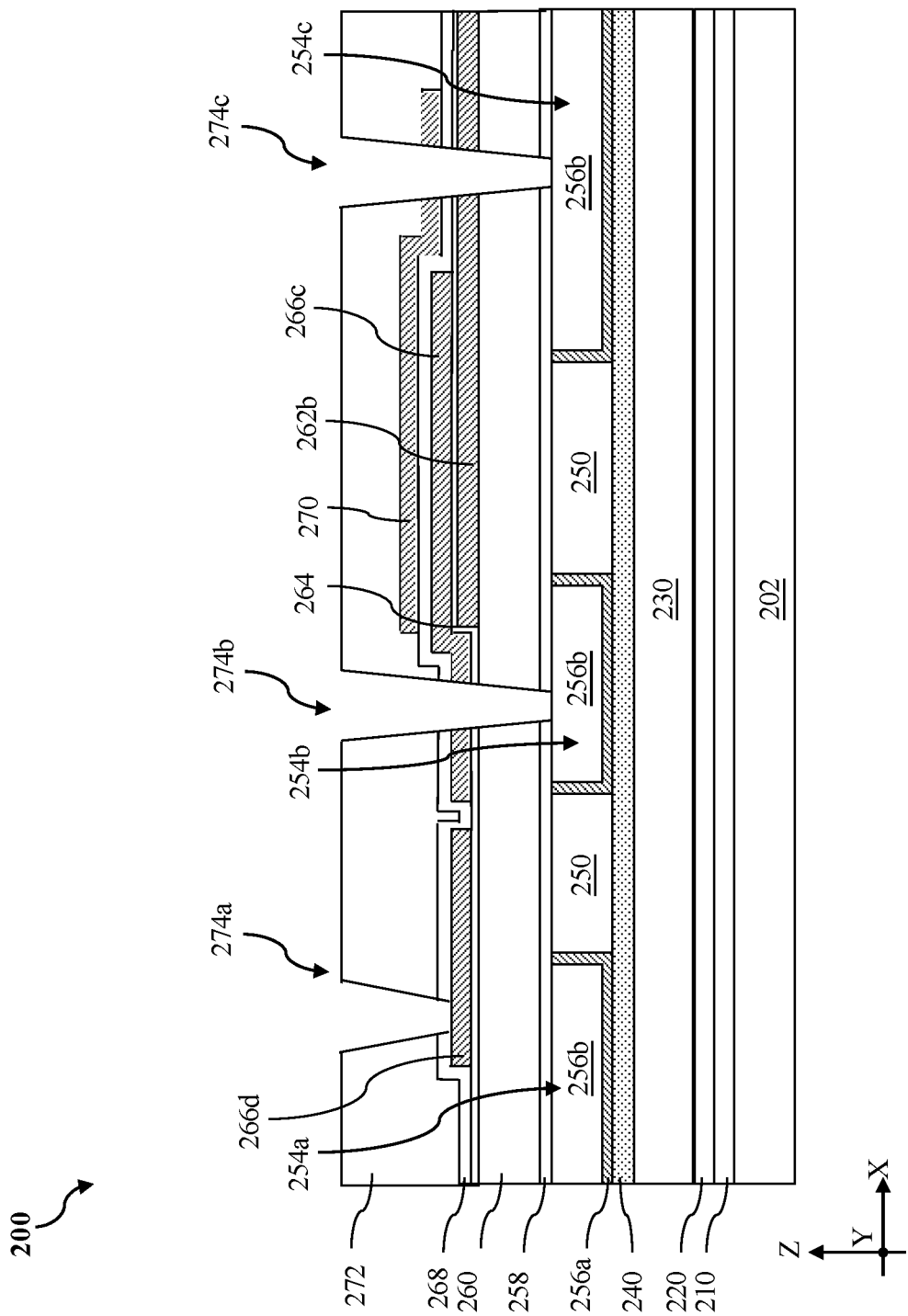

Referring to FIGS. 1 and 22, method 10 includes a block 26 where one or more openings (such as openings 274a, 274b, and 274c) are formed to expose surfaces of the electrodes of the resistor 271a and lower contact features 254b and 254a. In some embodiments, the openings 274a-274c may be formed in multiple steps. For example, the opening 274a may be formed by penetrating the fourth dielectric layer 272 and the second insulator layer 268 to expose a top surface of the first electrode 266d. Another opening (not shown) may be formed similarly to expose a top surface of the second electrode 266e. Openings 274b and 274c may be formed by penetrating through, from top to bottom, the fourth dielectric layer 272, the MIM structure 271b, the third dielectric layer 260, and the second dielectric layer 258. In some implementations, one or more rinse or cleaning processes may be performed to clean the exposed conductive surfaces, such as the sidewalls through the MIM structure 271b, the exposed portions of the lower contact features 254b and 254c, and the exposed portions of the electrodes 266d and 266e.

In some other embodiments, the openings 274a-274c may be formed simultaneously. In these embodiments, the openings 274a-274c all terminate on or in one of the lower contact features 254a, 254b, and 254c. For example, the openings (such as opening 274a), formed in the resistor region 200a, may also be formed to penetrate the fourth dielectric layer 272, the second insulator layer 268, the corresponding first electrode 266d/the second electrode 266e, the third dielectric layer 260, and the second dielectric layer 258.

Figure 23:
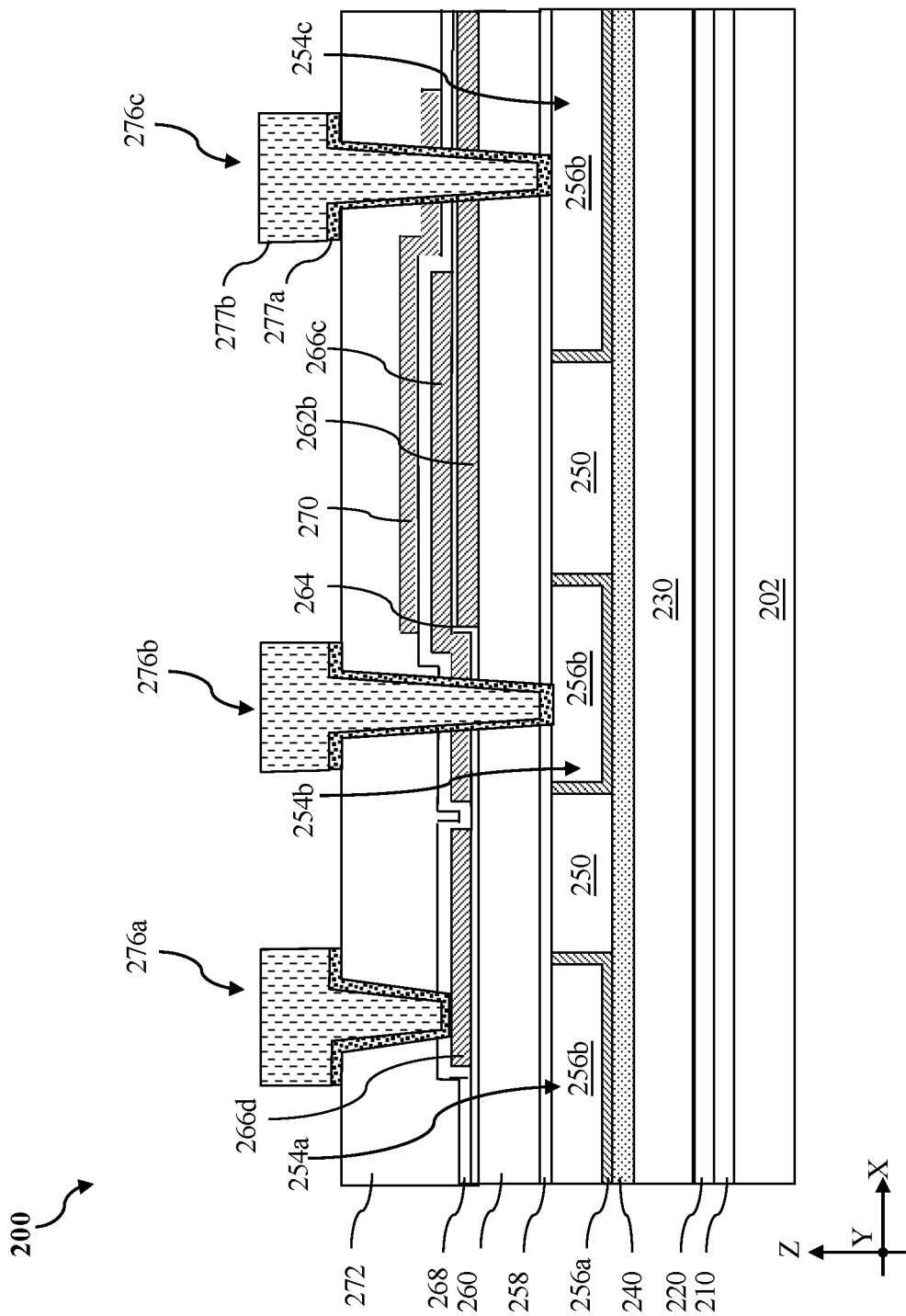

Referring to FIGS. 1 and 23, method 10 includes a block 28 where one or more upper contact features (such as 276a, 276b, and 276c) are formed in and over the openings 274a, 274b, and 274c, respectively. The upper contact features 276a, 276b, and 276c include contact vias that fill the openings 274a, 274b, and 274c and may be referred to as contact via, metal vias, or metal lines.

At least the upper portion of the upper contact features 276a, 276b, and 276c may be part of a redistribution layer (RDL) to reroute bond connections between upper and lower layers. The upper contact feature 276a penetrates through, from top to bottom, the fourth dielectric layer 272 and the second insulator layer 268 and makes electrical contact with the first electrode 266d of the resistor 271a. Similar processes may be performed to form an upper contact feature that electrically contacts with the second electrode 266e of the resistor 271a.

The upper contact features 276b and 276c each penetrate through, from top to bottom, the fourth dielectric layer 272, the MIM structure 271b, the third dielectric layer 260, and the second dielectric layer 258. The upper contact features 276b and 276c make electrical contact with the lower contact features 254b and 254c, respectively. The upper contact feature 276b is a middle-plate (MP) contact via that is electrically coupled to the middle conductive plate 266c but is electrically insulated from the bottom conductive plate 262b and the top conductive plate 270. The upper contact feature 276c is a top-plate-bottom-plate (TPBP) contact via that is electrically coupled to the bottom conductive plate 262b and the top conductive plate 270 but is electrically insulated from the middle conductive plate 266c.

In some embodiments, to form the one or more upper contact features (such as 276a, 276b, and 276c), a barrier layer 277a is first conformally deposited over the fourth dielectric layer 272 and into the openings 274a, 274b, and 274c using a suitable deposition technique, such as an ALD process, a PVD process or a CVD process, and then a metal fill layer 277b is deposited over the barrier layer 277a using a suitable deposition technique, such as an ALD process, a PVD process or a CVD process. In some embodiments, the barrier layer 277a may be formed of the same material of the conductive layer 262, conductive layer 266, and/or conductive layer 270. In those embodiments, the barrier layer 277a may be formed of titanium, tantalum, titanium nitride, or tantalum nitride. In one embodiment, the barrier layer 277a includes tantalum nitride. The metal fill layer 277b may be formed of copper, aluminum, or an alloy thereof. In some instances, the metal fill layer 277b for the upper contact features may include about 95% of aluminum and 5% of copper. The deposited barrier layer 277a and the metal fill layer 277b are then patterned to form upper contact features 276a, 276b, and 276c, as illustrated in the example in FIG. 23.

In some embodiments, the barrier layer 277a and the metal fill layer 277b are patterned in a two-stage or multiple-stage etch process. In embodiments represented in FIG. 23, portions of the upper contact features 276a, 276b, and 276c above the fourth dielectric layer 272 have substantially straight sidewalls. In other embodiments not explicitly shown in FIG. 23, portions of the upper contact features 276a, 276b, and 276c above the fourth dielectric layer 272 have tapered sidewalls. While not shown in the figures, the upper contact features 276a, 276b, and 276c may have a substantially square shape, a circular shape, an oval shape, a racetrack shape, a polygon shape, or a rectangular shape when viewed along the Z direction.

Figure 24:
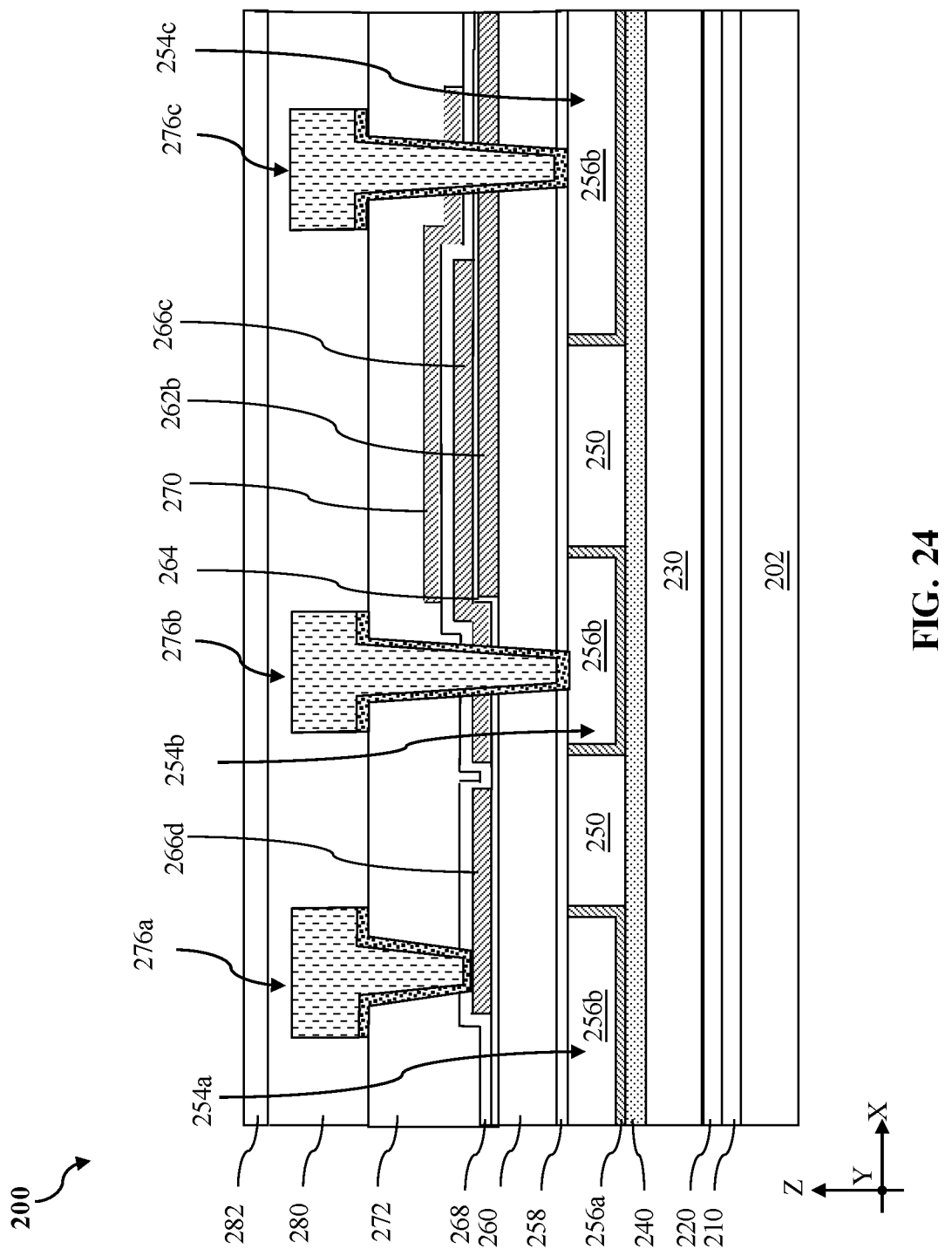

Referring to FIGS. 1 and 24, method 100 includes a block 30 where a passivation structure is formed over upper contact features 276a, 276b, and 276c and over the fourth dielectric layer 272. As shown in FIG. 24, a first passivation layer 280 is formed over the workpiece 200, including over the upper contact features 276a, 276b, and 276c and the fourth dielectric layer 272. In some embodiments, the first passivation layer 280 may include one or more plasma-enhanced oxide layers, one or more undoped silica glass layers, or a combination thereof. The first passivation layer 280 may be formed using CVD, spin-on coating, or other suitable technique. In some implementations, the first passivation layer 280 may be formed to a thickness between about 1000 nm and about 1400 nm, such as between about 1100 nm and 1300 nm.

A second passivation layer 282 is formed over the first passivation layer 280. In some embodiments, the second passivation layer 282 may include silicon nitride (SiN) and may be formed by CVD, PVD or a suitable method to a thickness between about 600 nm and about 800 nm, such as between about 650 nm and 750 nm.

Figure 25:
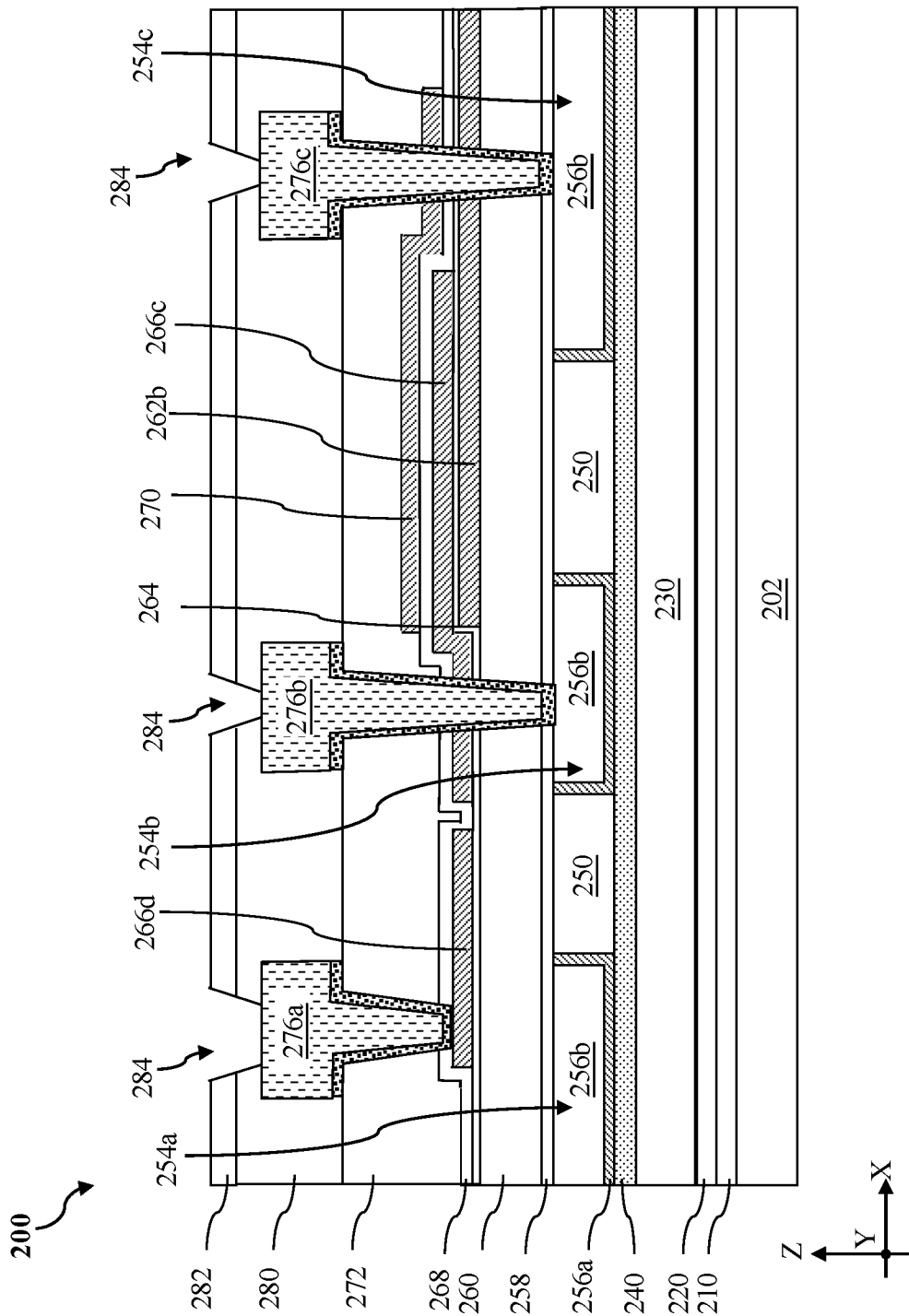
Figure 26:
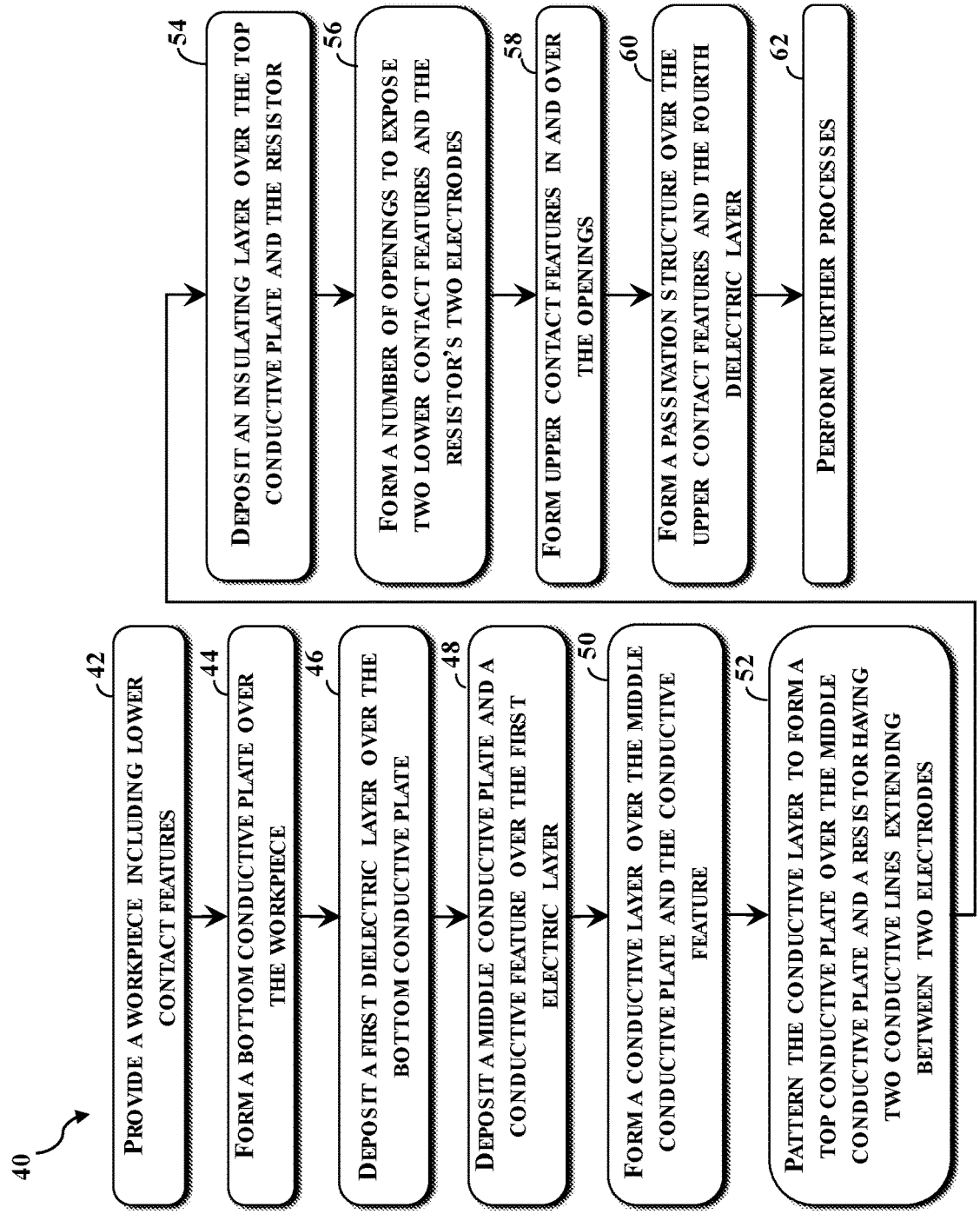
FIG. 26 is a flow chart of another method for fabricating another exemplary semiconductor structure in accordance with embodiments of the present disclosure.

Referring to FIGS. 1 and 25, method 10 includes a block 32 where further processes may be performed. Such further processes may include formation of the openings 284 through the first passivation layer 280 and the second passivation layer 282, deposition of one or more polymeric material layers, patterning of the one or more polymeric material layers, deposition of an under-bump-metallurgy (or under-bump-metallization, UBM) layer, deposition of a copper-containing bump layer, deposition of a cap layer, deposition of a solder layer, and reflowing of the solder layer. These further processes form contact structures for connection to external circuitry.

In methods and structures depicted above, the resistor 271a is formed along with the middle conductive plate 266c of the MIM structure 271b. However, the resistor 271a may also be formed along with another conductive plate of the MIM structure. For example, in the method 40 (illustrated in the exemplary flowchart in FIG. 26 and described below in conjunction with FIGS. 27-33), a resistor 471a according to the present disclosure is formed along with a top conductive plate of a MIM structure 471b.

Figure 27:
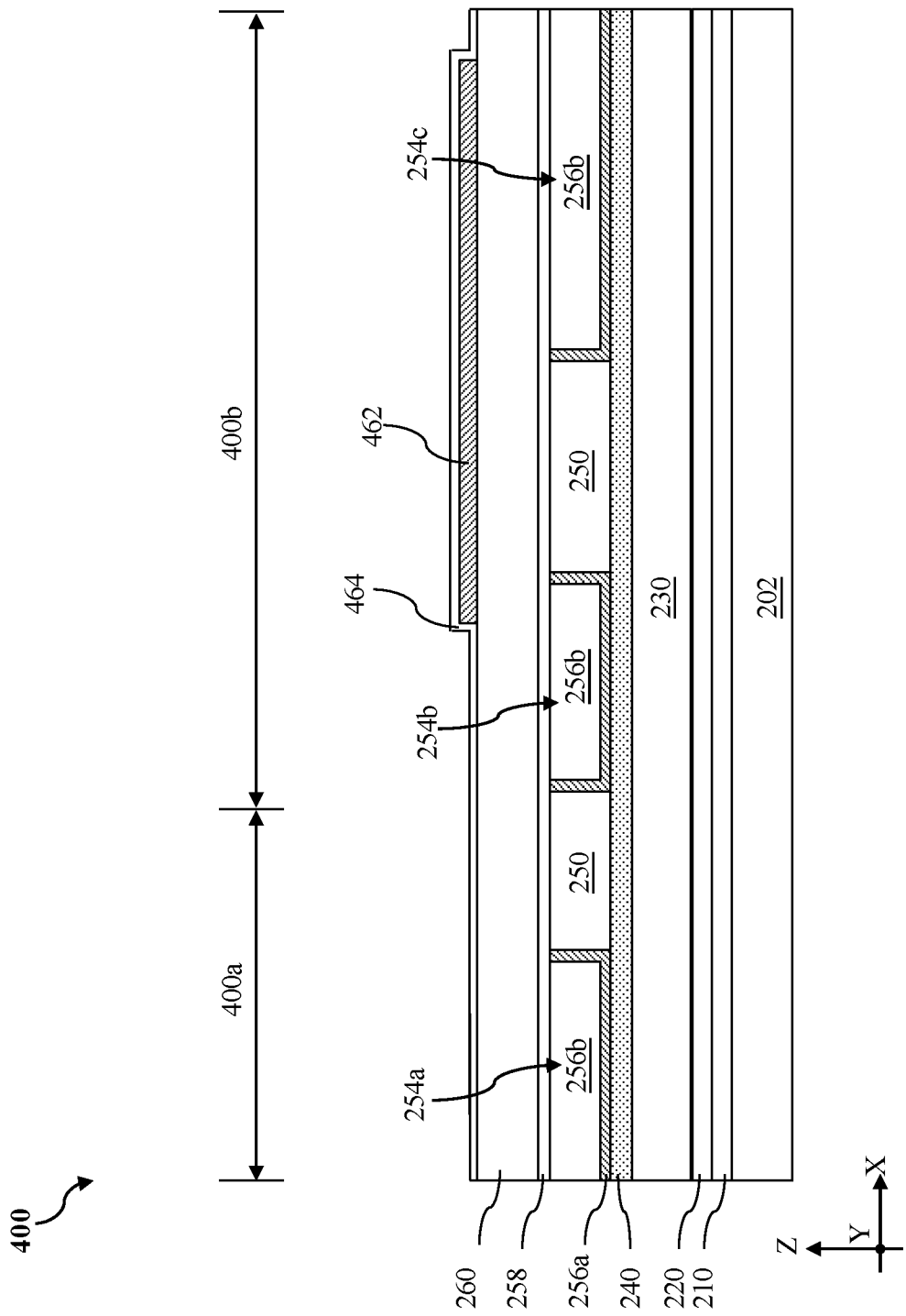
FIGS. 27-33 are cross-sectional views of a portion of another workpiece undergoing the method according to various aspects of the present disclosure.

Referring to FIGS. 26-27, method 40 includes a block 42 where a workpiece 400 is provided with lower contact features 254a, 254b and 265c. The workpiece 400 may be formed in similar processes as discussed above with reference to FIGS. 2-8.

Still referring to FIGS. 26-27, method 40 includes a block 44 where a patterned bottom conductive plate 462 is formed on the workpiece in a capacitor region 400b. The bottom conductive plate 462 may be formed in a way similar to that used to form the bottom conductive plate 262b discussed with reference to FIGS. 9-10. It is noted that, different from block 14 of method 10, no conductive feature is formed in a resistor region 400a at block 44 of method 40.

Still referring to FIGS. 26-27, method 40 includes a block 46 where a first insulator layer 464 is formed over the bottom conductive plate 462 in both the resistor region 400a and the capacitor region 400b. The first insulator layer 464 may be formed in a way similar to that used to form the first insulator layer 264 as described above with reference to FIG. 12. For example, the first insulator layer 464 is conformally deposited to have a generally uniform thickness over the top surface of the workpiece 400 (e.g., having substantially the same thickness on top and sidewall surfaces of the bottom conductive plate 462) and covers sidewalls of the bottom conductive plate 462.

Figure 28:
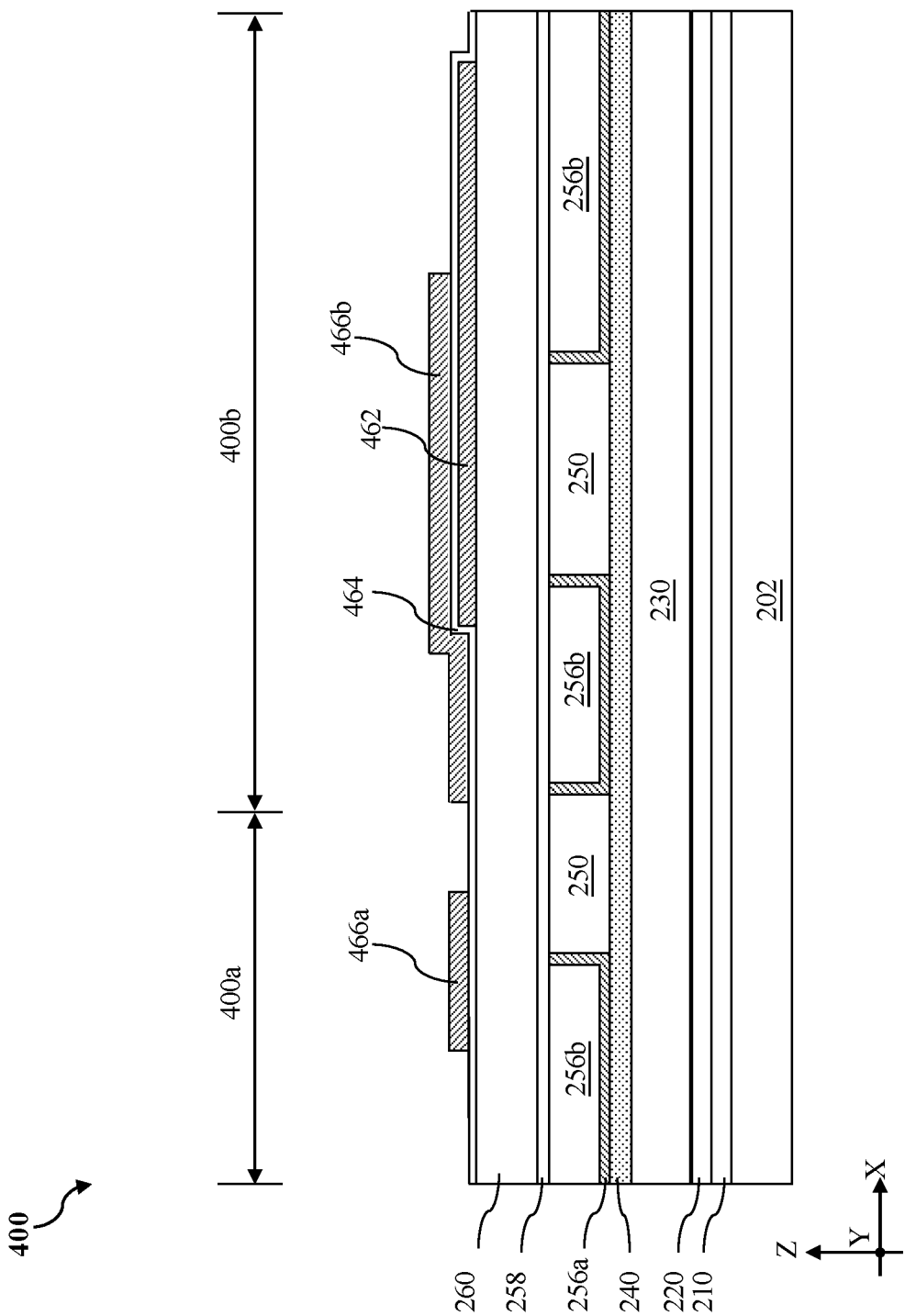

Now referring to FIGS. 26 and 28, method 40 includes a block 48 where a conductive feature 466a is formed in the resistor region 400a and a middle conductive plate 466b is formed in the capacitor region 400b. In some embodiments, the formation of the conductive feature 466a and the middle conductive plate 466b may involve forming a middle conductive layer (not shown), and then patterning the middle conductive layer to form the conductive feature 466a and the middle conductive plate 466b. The middle conductive layer may be formed in a way similar to that used to form the middle conductive layer 266 as described above with reference to FIG. 13. The top view of the workpiece 400 after patterning the middle conductive layer may be similar to the top view of the workpiece 200 discussed above with reference to FIG. 11. As described above, the conductive feature 466a and the middle conductive plate 466b may be customized to have different shapes and dimensions to meet design needs. For example, the conductive feature 466a may have shapes similar to conductive features 262a', 262a" or 262c shown in FIG. 34A, 35A or 36.

Figure 29:
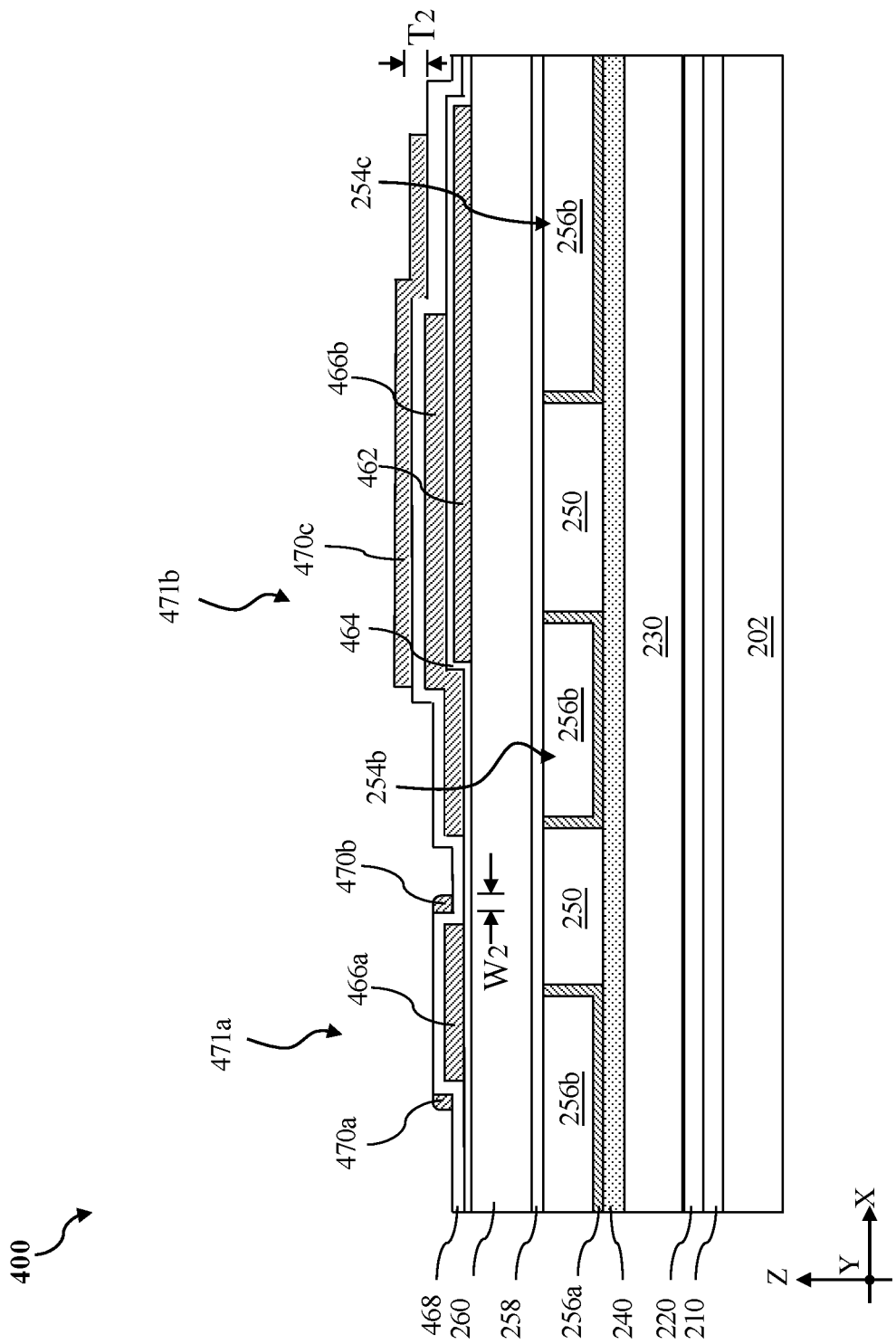

Referring to FIGS. 26 and 29, method 40 includes blocks 50 and 52 where a top conductive layer is formed and then patterned over the workpiece 400. In an embodiment, the top conductive layer (not shown) is conformally deposited to have a generally uniform thickness $T_2$ over the top surface of the workpiece 400. In some embodiments, the thickness $T_2$ of the top conductive layer is less than 100 nm, for example, between about 30 nm and about 80 nm. In this depicted example, a thickness of the top conductive layer may be between about 35 nm and about 45 nm. The material of the top conductive layer may be same to the bottom conductive layer 462. For example, the top conductive layer may be made of aluminum, copper, tungsten, titanium, tantalum, titanium nitride, tantalum nitride, or another applicable material. In this depicted example, the top conductive layer is also formed of titanium nitride.

As shown in FIG. 29, the top conductive layer is patterned to form a resistor 471a and a top conductive plate 470c of the MIM structure 471b in a way similar to that used to form the resistor 271a and middle conductive plate 266c as described above with reference to FIGS. 13-16. Similarly, the resistor 471a includes two conductive lines 470a, 470b and two electrodes (electrode 470d shown in FIG. 31, the other is not explicitly shown in the figures). The two conductive lines 470a and 470b are spaced apart from and insulated from the conductive feature 466a by the second insulator layer 468. The two electrodes (electrode 470d shown in FIG. 31) may extend lengthwise along the X direction. Thus, without applying a high-resolution lithography, conductive lines 470a and 470b with small widths may be formed at the sidewalls of the second insulator layer 468. In other words, formation of the conductive lines 470a and 470b does not require forming a photoresist pattern that selectively exposes or covers the areas where the conductive lines 470a and 470b are formed.

Referring to FIG. 29, the width $W_2$ of the conductive lines 470a and 470b may be substantially equal to the deposition thickness $T_2$ of the top conductive layer 470. In some embodiments, the width $W_2$ of the conductive lines 470a and 470b is less than 100 nm, for example, between about 30 nm and about 80 nm, such as between about 35 nm and about 45 nm. By forming the conductive lines 470a and 470b with a small width, high resistance may be then obtained. In some embodiments, the resistor 471a may provide a resistance ranged from about 500Ω to about 5 MΩ, for example.

In some embodiments, the first insulator layer 464 and/or the second insulator layer 468 use high-k dielectric material(s) whose k-value is greater than that of silicon oxide. In some implementations, the first insulator layer 464 and/or the second insulator layer 468 is a tri-layer structure including, from bottom to top, a first zirconium oxide ($ZrO_2$) layer, an aluminum oxide ($Al_2O_3$) layer, and a second zirconium oxide ($ZrO_2$) layer, and a total thickness of the $ZrO_2/Al_2O_3/ZrO_2$ (ZAZ) dielectric may range from 4 nm to 10 nm, for example.

Figure 30:
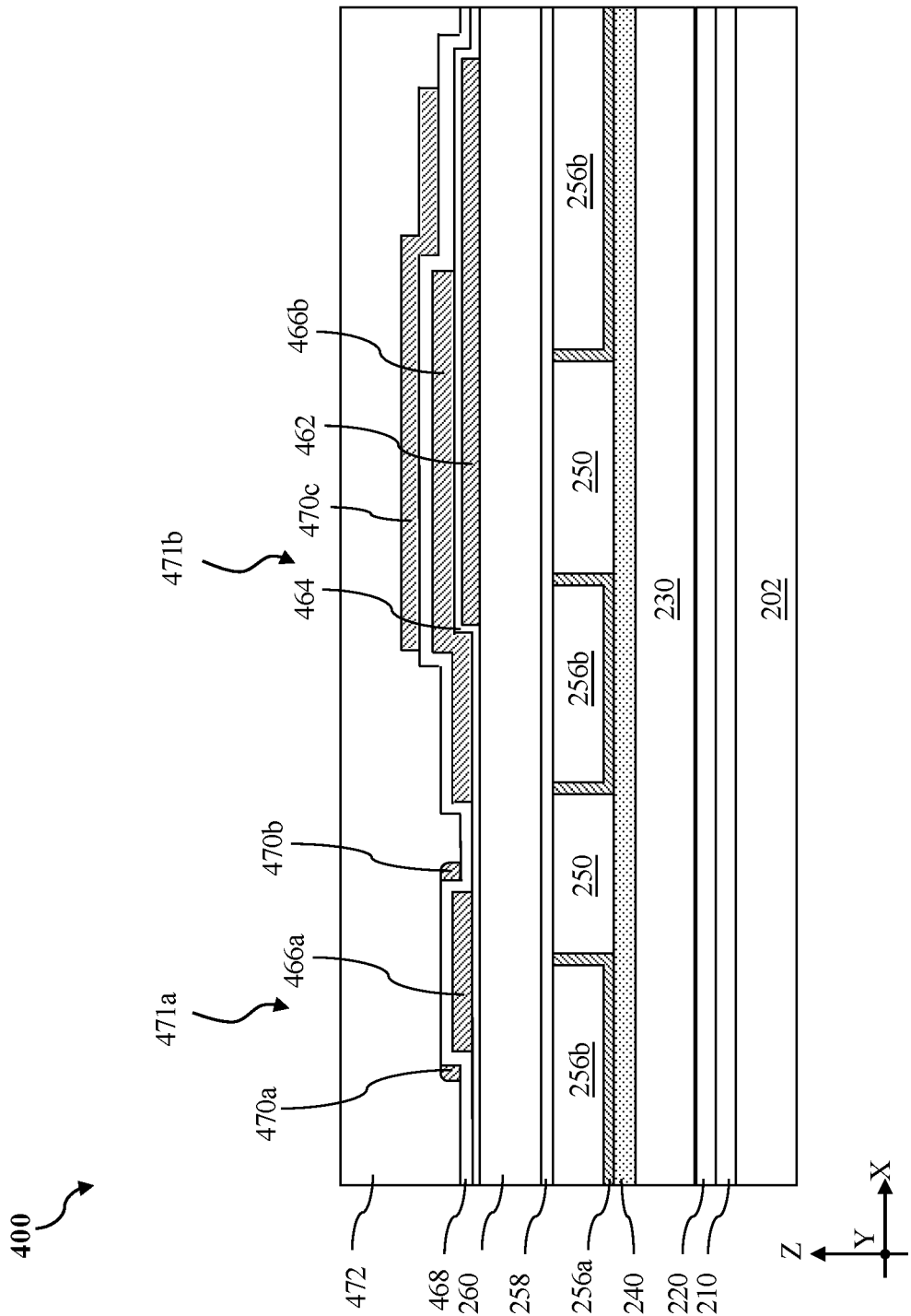
Figure 31:
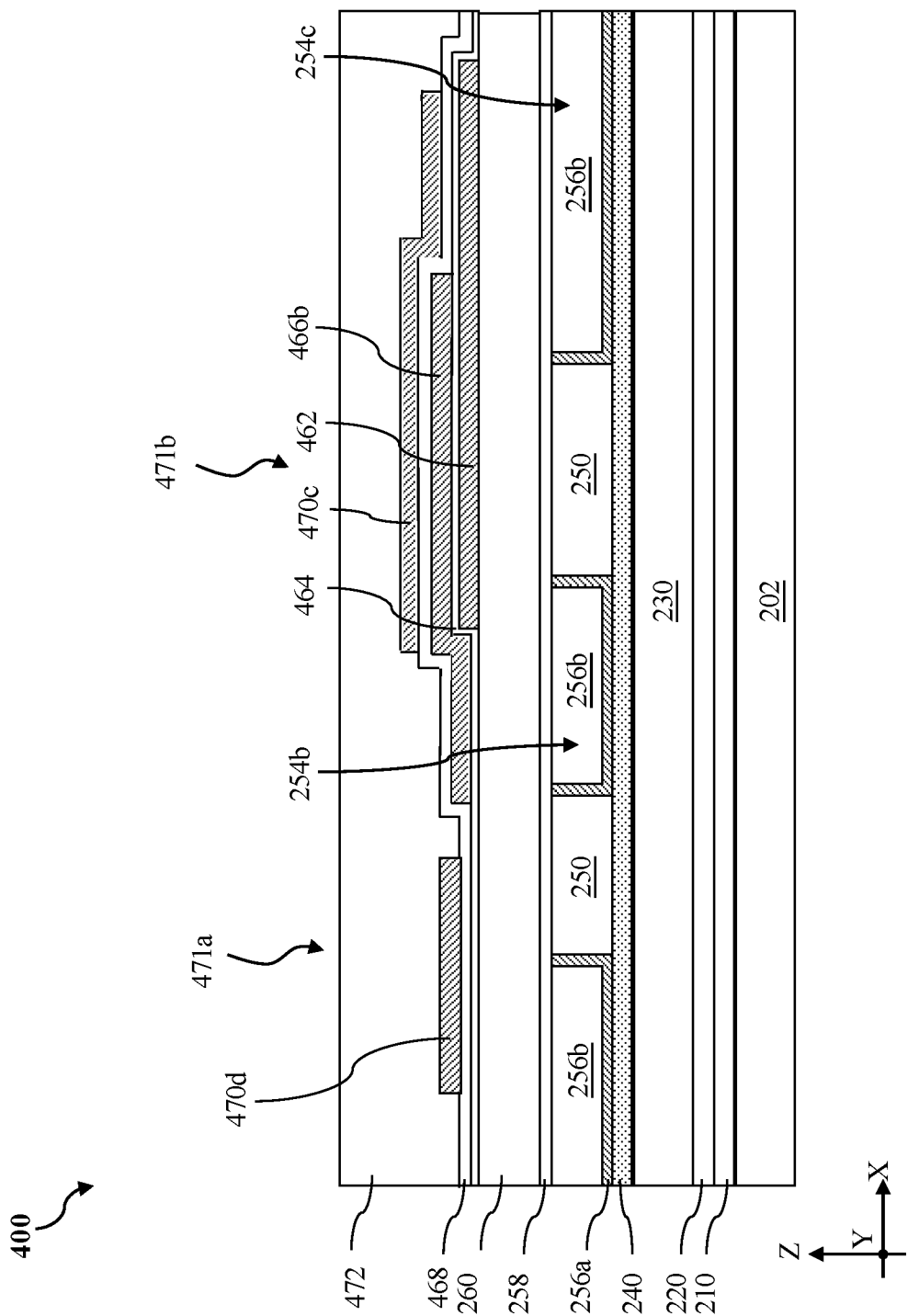

Referring to FIGS. 26 and 30-31, method 40 includes a block 54 where a fourth dielectric layer 472 is deposited over the resistor 471a and the MIM structure 471b. FIG. 30 depicts a cross-sectional view of the workpiece 400 after the formation of the fourth dielectric layer 472 taken along a line that cuts across the conductive lines 470a and 470b in the X direction (similar to the line A-A' in FIG. 15). FIG. 31 depicts a cross-sectional view of the workpiece after the formation of the fourth dielectric layer 472 taken along a line that cuts across the electrode 470d in the X direction (similar to the line B-B' in FIG. 15). The formation of the fourth dielectric layer 472 may be similar to that used to form the fourth dielectric layer 272 as described with reference to FIGS. 20-21.

Figure 32:
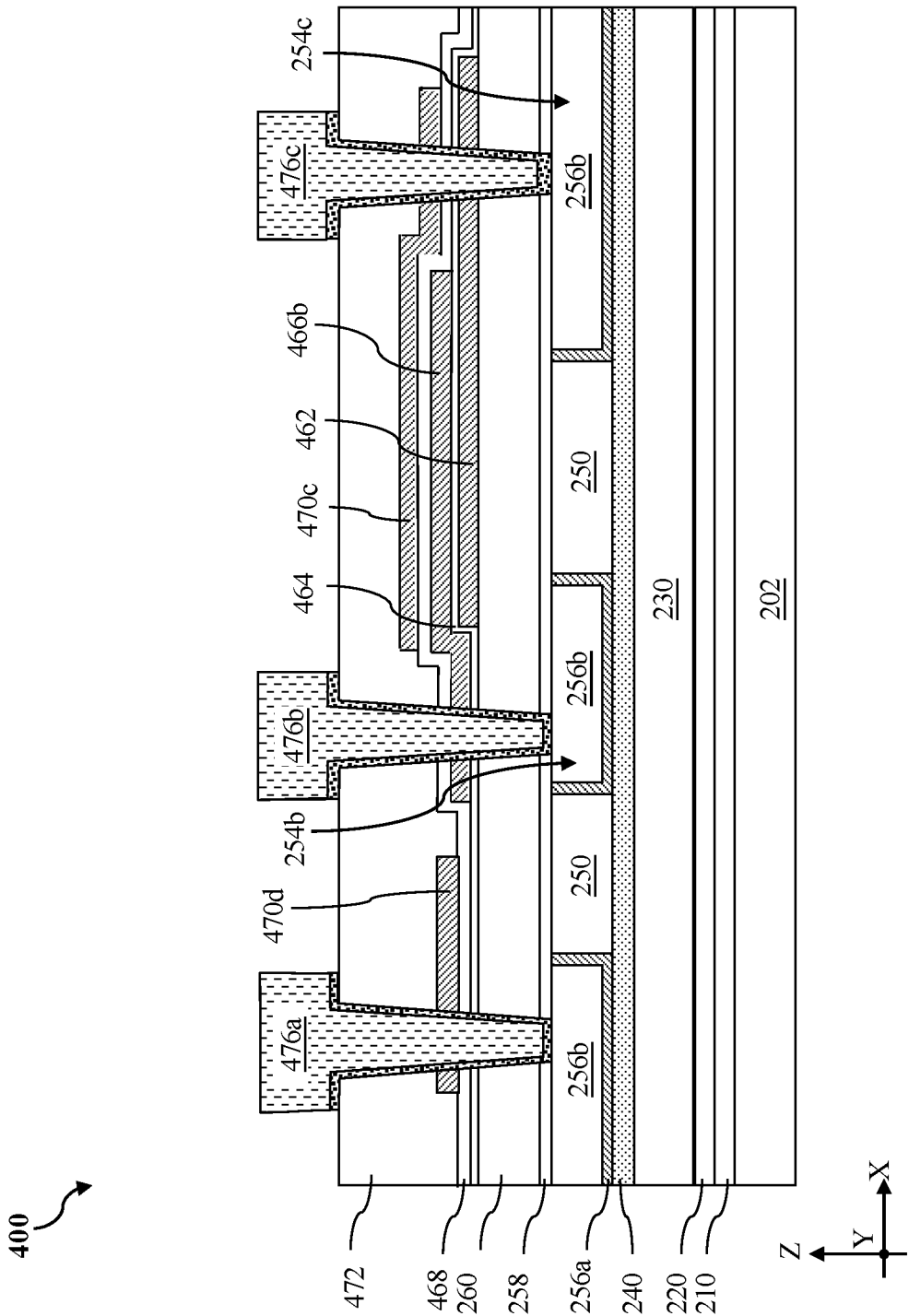

Referring to FIGS. 26 and 32, method 40 includes blocks 56 and 58 where one or more openings (not shown) are formed using a plurality of etch processes. Then, one or more upper contact features (such as upper contact features 476a-476c) are formed in the openings. In this depicted example, the openings (not shown) in the resistor region 400a and the in the capacitor region 400b may be formed simultaneously. For example, the openings in the resistor region 400a may be formed by penetrating the fourth dielectric layer 472, the corresponding electrode (such as the electrode 470d), the second insulator layer 468, the third dielectric layer 260, and the second dielectric layer 258. Openings in the resistor region 400a may be formed by penetrating through, from top to bottom, the fourth dielectric layer 472, the MIM structure 471b, the third dielectric layer 260, and the second dielectric layer 258. In some implementations, one or more rinse or cleaning processes may be performed to clean the exposed conductive surfaces, such as the sidewalls through the MIM structure 271b, the exposed portions of the lower contact features 254ba, 254b and 254c, and the exposed portions of the electrodes (electrode 470d shown in FIG. 32). In some other embodiments, the formation of the openings and upper contact features 476a-476c may be similar to that used to form the openings 274a-274c and the upper contact features 276a-276c as described with reference to FIGS. 22-23.

Figure 33:
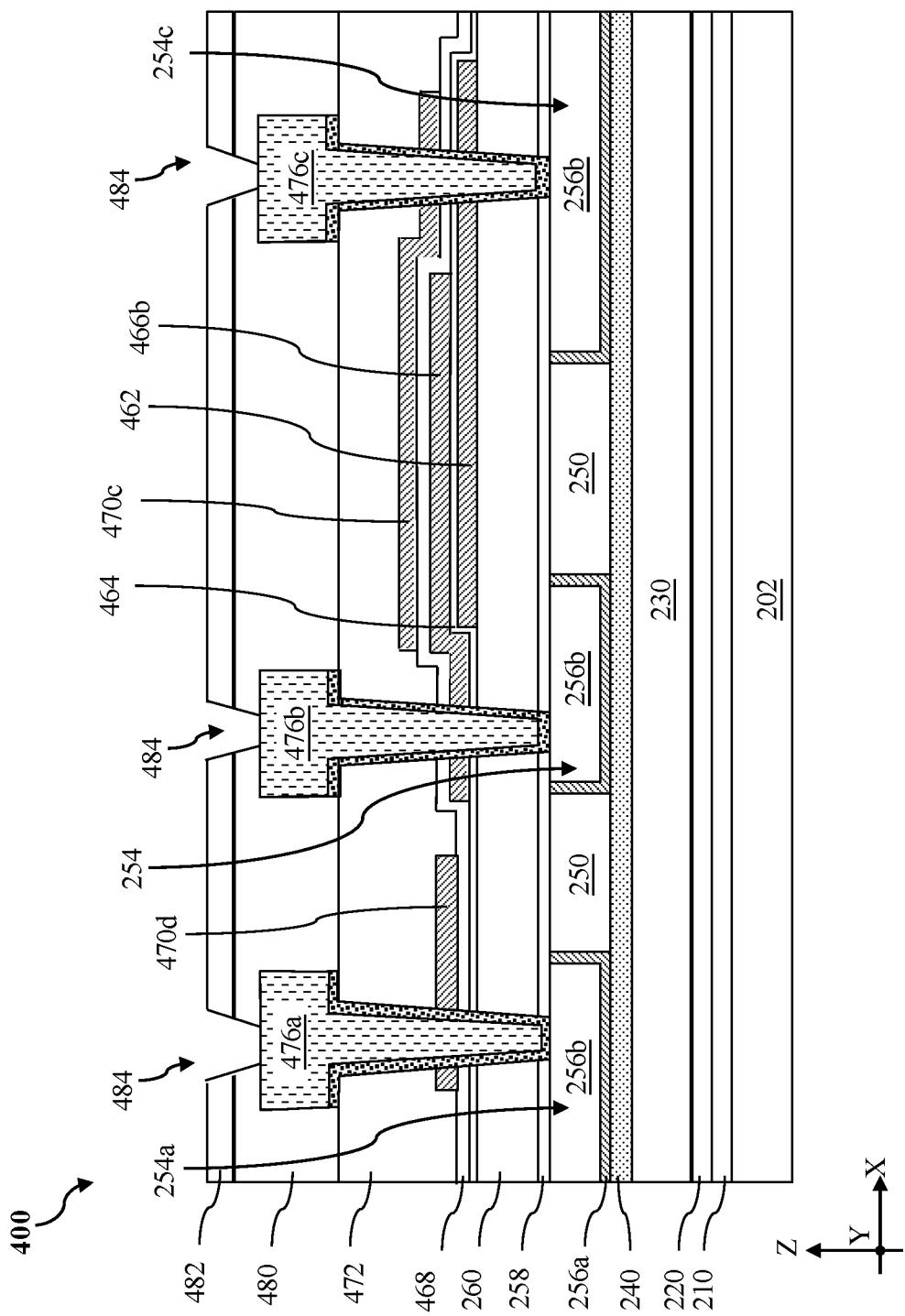

Referring to FIGS. 26 and 33, method 40 includes a block 60 where a passivation structure is formed over upper contact features 476a, 476b, and 476c and over the fourth dielectric layer 472. As shown in FIG. 33, a first passivation layer 480 and a second passivation layer 482 are formed over the workpiece 400. The formation of the first passivation layer 480 and a second passivation layer 482 may be similar to that used to form the first passivation layer 280 and a second passivation layer 282 as described with reference to FIG. 24.

Still referring to FIGS. 26 and 33, method 40 includes a block 62 where further processes may be performed. Such further processes may include formation of the openings 484 through the first passivation layer 480 and the second passivation layer 482, deposition of one or more polymeric material layers, patterning of the one or more polymeric material layers, deposition of an under-bump-metallurgy (or under-bump-metallization, UBM) layer, deposition of a copper-containing bump layer, deposition of a cap layer, deposition of a solder layer, and reflowing of the solder layer. These further processes form contact structures for connection to external circuitry.

As discussed above, the shape and size of the conductive features 262a/466a may affect the shape and length of the conductive lines 226a/266b or 470a/470b, and thus affect the resistance of the resistor 271a/471a. Three exemplary shapes for the conducive feature 262a and corresponding shapes of the conductive lines 226a/266b are shown with reference to FIGS. 34A, 35A, 36A and FIGS. 34B, 35B, 36B, respectively. Similar shapes can also be applied to the patterning of the conductive features 466a to obtain corresponding conductive lines and meet different requirements for the resistor 471a.

Figure 34A:
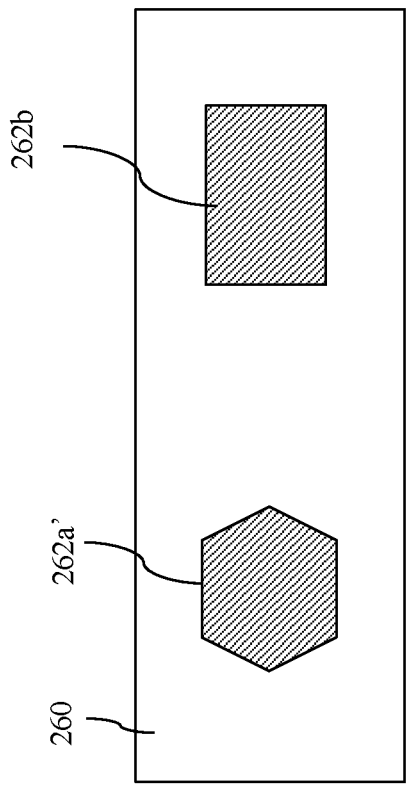
Figure 34B:
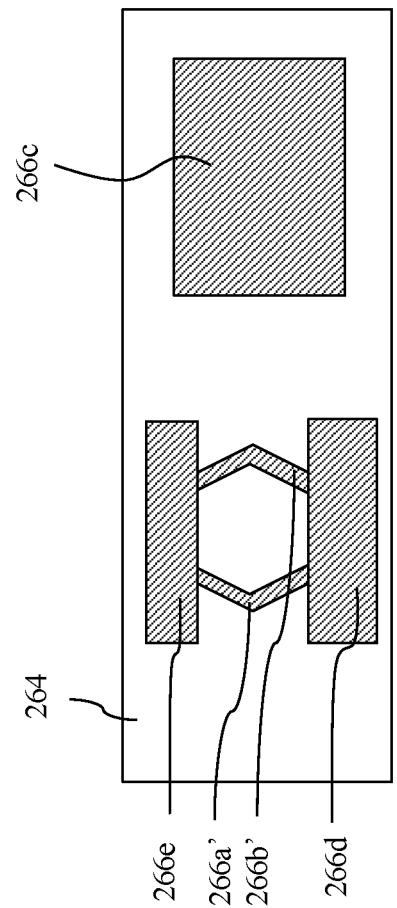

For example, as shown in FIG. 34A, a conductive feature 262a' has a hexagon shape. Thus, after patterning the middle conductive layer 266, conductive lines 266a'/266b' would extend along sidewalls of the hexagon, as shown in FIG. 34B. Comparing to the shape of the conductive feature 262a shown in FIG. 11, lengths of the conductive lines 266a'/266b' are increased, and the conductive lines 266a'/266b' are longer than the conductive lines 266a/266b when the area of the conductive feature 262a' is substantially equal to the area of the conductive feature 262a. Thus, due to the equation (1), a resistor with a larger resistance may be obtained.

Figure 36A:
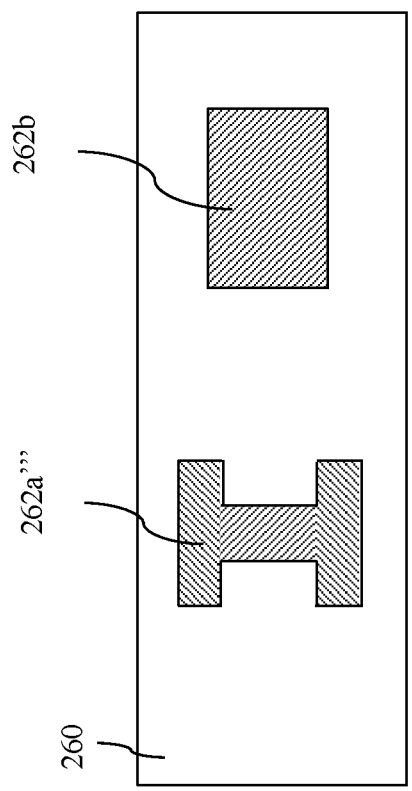
Figure 36B:
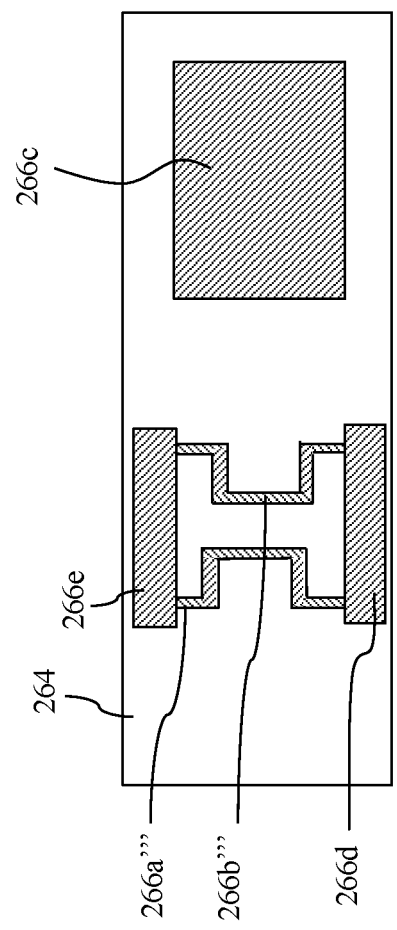

As shown in FIG. 35A, a conductive feature 262a" has a serpentine shape. Corresponding shapes of the conductive lines 266a"/266b" are shown in FIG. 35B. As shown in FIG. 36A, a conductive feature 262a''' has a shape of a letter "I". Corresponding shapes of the conductive lines 266a'''/266b''' are shown in FIG. 36B. Although a limited number of shapes are shown, the present disclosure may not be so limited. The conductive feature 262a may also be patterned to other shapes, such as round, oval, or irregular shapes, to change lengths of the conductive lines and thus resistance of the resistor 471a.

Methods and semiconductor structures according to the present disclosure provide advantages. For example, methods of the present disclosure form a high-resistance resistor along with a MIM structure without employing high-resolution photolithography. As such, methods of the present disclosure may form resistor structures at a reduced cost.

One aspect of the present disclosure involves a method. The method includes forming a conductive feature and a first conductive plate over a substrate, conformally depositing a dielectric layer over the conductive feature and the first conductive plate, conformally depositing a conductive layer over the conductive feature and the first conductive plate, and patterning the conductive layer to form a second conductive plate over the first conductive plate and a conductive line extending along a sidewall of the conductive feature.

In some embodiments, the patterning includes removing the conductive layer directly over the conductive feature. In some embodiments, the patterning includes physically separating the conductive line and the second conductive plate. In some embodiments, the sidewall is a first sidewall, the patterning includes forming a first electrode extending along a second sidewall of the conductive feature and a second electrode extending along a third sidewall of the conductive feature, the first electrode electrically contacts a proximal end of the conductive line and the second electrode electrically contacts a distal end of the conductive line. In some implementations, after the patterning, the conductive line and the first electrode are isolated from the conductive feature by the dielectric layer.

In some implementations, the method also includes depositing a passivation layer over the second conductive plate, the conductive line, the first electrode, and the second electrode, and patterning the passivation layer to form a first opening and a second opening to expose the first electrode and the second electrode, respectively.

In some instances, the substrate includes an interconnect structure, and the patterning of the passivation layer also forms a third opening through the second conductive plate to expose a lower contact feature electrically coupled to the interconnect structure. In some instances, the conductive layer, the conductive feature, and the first conductive plate include titanium nitride.

In some implementations, the method also includes depositing a top dielectric layer over the second conductive plate and the conductive line after the patterning of the conductive layer and forming a third conductive plate over the second conductive plate after the depositing of the top dielectric layer.

In some implementations, the method also includes forming a third conductive plate over the substrate before the forming of the conductive feature and the first conductive plate and depositing a bottom dielectric layer over the third conductive plate, the conductive feature and the first conductive plate are formed over the bottom dielectric layer.

Another aspect of the present disclosure involves a method. The method includes forming a conductive feature over a substrate, conformally depositing a dielectric layer over the conductive feature, conformally depositing a conductive layer over the dielectric layer, and performing an etch process on the conductive layer to form a first conductive line and a second conductive line extending along a first sidewall and a second sidewall of the conductive feature, and form a first electrode electrically contacts proximal ends of the two conductive lines and a second electrode electrically contacts distal ends of the two conductive lines.

In some embodiments, the method also includes providing a photoresist over the conductive layer to cover a predetermined region before the performing of the etch process, the etch process forms the first electrode and the second electrode in the predetermined region. In some embodiments, the method also includes forming a first conductive plate over the substrate before the conformally depositing of the dielectric layer, the performing of the etch process further forms a second conductive plate over the first conductive plate.

In some implementations, a width of the first conductive line is less than about 100 nm. In some embodiments, the conductive layer comprises titanium nitride, copper, cobalt, or tungsten. In some instances, the conductive feature may substantially have a quadrangle shape, a hexagon, or may have a shape of a letter I.

Still another aspect of the present disclosure involves a semiconductor structure. The semiconductor structure includes a resistor disposed on a surface. The resistor includes a first electrode and a second electrode, and two conductive lines extending between the first electrode and the second electrode. The semiconductor structure also includes a capacitor disposed on the surface. The capacitor includes a first plate conductor, and a second plate conductor over the first plate conductor, the resistor and the second plate conductor include a same material.

In some embodiments, the material includes titanium nitride, copper, cobalt, or tungsten. In some embodiments, a width of each of the two conductive lines is substantially equal to a thickness of the second plate conductor. In some implementations, the capacitor also includes a bottom plate conductor under the first plate conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate comprising a first region and a second region;
   a first material layer disposed directly over the first region and comprising a first sidewall and a second sidewall opposite the first sidewall along a first direction;
   a conformal second material layer disposed over the first material layer and the substrate, wherein the conformal second material layer comprises a first portion in direct contact with the first sidewall and a second portion in direct contact with the second sidewall;
   a first conductive line disposed adjacent to the first portion of the conformal second material layer along the first direction and extending lengthwise along a second direction that is substantially perpendicular to the first direction;
   a second conductive line disposed adjacent to the second portion of the conformal second material layer along the first direction and extending lengthwise along the second direction;
   a third conductive line in direct contact with distal ends of the first and second conductive lines; and
   a fourth conductive line in direct contact with proximal ends of the first and second conductive lines.

2. The semiconductor structure of claim 1, wherein the first material layer comprises titanium nitride.

3. The semiconductor structure of claim 1, wherein the conformal second material layer comprises a dielectric material.

4. The semiconductor structure of claim 1, wherein the first, second, third, and fourth conductive lines comprise a same composition.

5. The semiconductor structure of claim 4, wherein the first, second, third, and fourth conductive lines comprise titanium nitride.

6. The semiconductor structure of claim 1, wherein the first, second, third, and fourth conductive lines comprise a same thickness.

7. The semiconductor structure of claim 1, wherein a width of the first conductive line is substantially equal to a width of the second conductive line.

8. The semiconductor structure of claim 1, wherein a width of the first conductive line along the first direction is substantially equal to a thickness of the third conductive line.

9. The semiconductor structure of claim 1, further comprising:
   a metal-insulator-metal capacitor disposed over the second region,
   wherein a composition of a conductor plate of the capacitor is the same as a composition of the first conductive line.

10. A semiconductor structure, comprising:
    a resistor disposed on a surface, the resistor comprising:
      a first electrode and a second electrode, and
      a first conductive line and a second conductive line extending between the first electrode and the second electrode,
    wherein the first and second electrodes and the first and second conductive lines are formed of a same material.

11. The semiconductor structure of claim 10, wherein the first and second electrodes and the first and second conductive lines have a same thickness.

12. The semiconductor structure of claim 10, wherein a width of the first conductive line is substantially equal to a thickness of the first electrode.

13. The semiconductor structure of claim 10, wherein a width of the first conductive line is substantially equal to a width of the second conductive line.

14. The semiconductor structure of claim 10, further comprising:
 a dielectric layer,
  wherein the first conductive line is isolated from the second conductive line by the dielectric layer.

15. The semiconductor structure of claim 10, further comprising:
 a passivation layer over the resistor;
 a first via extending through the passivation layer and in direct contact with the first electrode; and
 a second via extending through the passivation layer and in direct contact with the second electrode.

16. The semiconductor structure of claim 10, further comprising:
 a metal-insulator-metal capacitor on the surface,
  wherein a composition and a thickness of a conductor plate of the capacitor are substantially the same as a composition and a thickness of the first conductive line, respectively.

17. A semiconductor structure, comprising:
 a resistor disposed on a surface, the resistor comprising:
  a first electrode and a second electrode, and
  two conductive lines extending between the first electrode and the second electrode; and
 a capacitor disposed on the surface, the capacitor comprising:
  a first plate conductor, and
  a second plate conductor over the first plate conductor,
 wherein a width of one of the two conductive lines is substantially equal to a thickness of the second plate conductor.

18. The semiconductor structure of claim 17, wherein the first and second electrodes and the two conductive lines are formed of a same material.

19. The semiconductor structure of claim 18, wherein the material comprises titanium nitride, copper, cobalt, or tungsten.

20. The semiconductor structure of claim 17, wherein the two conductive lines and the second plate conductor are formed of a same material.

* * * * *